United States Patent
Iijima et al.

(10) Patent No.: US 10,615,243 B2
(45) Date of Patent: Apr. 7, 2020

(54) LIGHT-EMITTING DEVICE COMPRISING FLEXIBLE SUBSTRATE AND LIGHT-EMITTING ELEMENT

(71) Applicant: PANASONIC INTELLECTUAL PROPERTY MANAGEMENT CO., LTD., Osaka (JP)

(72) Inventors: Hiroaki Iijima, Osaka (JP); Akihito Miyamoto, Osaka (JP); Kenichi Sasai, Osaka (JP); Yoshichika Osada, Osaka (JP); Masumi Izuchi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/966,821

(22) Filed: Apr. 30, 2018

(65) Prior Publication Data
US 2018/0254312 A1    Sep. 6, 2018

Related U.S. Application Data

(62) Division of application No. 14/988,855, filed on Jan. 6, 2016, now Pat. No. 9,991,326.

(30) Foreign Application Priority Data

Jan. 14, 2015    (JP) ................. 2015-005353

(51) Int. Cl.
*H01L 27/32*     (2006.01)
*H01L 51/52*     (2006.01)
*H01L 51/00*     (2006.01)

(52) U.S. Cl.
CPC ...... *H01L 27/3276* (2013.01); *H01L 27/3248* (2013.01); *H01L 27/3262* (2013.01);
(Continued)

(58) Field of Classification Search
CPC . H01L 25/167; H01L 27/1248; H01L 27/153; H01L 27/156; H01L 27/283;
(Continued)

(56) References Cited

U.S. PATENT DOCUMENTS

2005/0046346 A1    3/2005    Tsuchiya et al.
2005/0110020 A1    5/2005    Hayashi et al.
(Continued)

FOREIGN PATENT DOCUMENTS

JP    2005-108824 A    4/2005
JP    2005-251721 A    9/2005
(Continued)

*Primary Examiner* — Yu Chen
(74) *Attorney, Agent, or Firm* — Greenblum & Bernstein, P.L.C.

(57) ABSTRACT

The light-emitting device includes a flexible substrate, a lower barrier layer positioned above the flexible substrate, a light-emitting element and a thin-film transistor controlling the light-emitting element positioned above the lower barrier layer, a first upper barrier layer positioned above the light-emitting element and including a first inorganic material, and a second upper barrier layer positioned above the thin-film transistor and including a second inorganic material. The first upper barrier layer and the second upper barrier layer are spaced from each other at least in a region between the light-emitting element and the thin-film transistor.

6 Claims, 8 Drawing Sheets

(52) U.S. Cl.
CPC ...... *H01L 51/0097* (2013.01); *H01L 51/5253* (2013.01); *H01L 51/5256* (2013.01); *H01L 27/3258* (2013.01); *H01L 27/3274* (2013.01); *H01L 51/5246* (2013.01); *H01L 2251/5338* (2013.01); *Y02E 10/549* (2013.01)

(58) Field of Classification Search
CPC ............... H01L 27/124; H01L 27/1244; H01L 27/3248; H01L 27/3253; H01L 27/3258; H01L 27/3262; H01L 27/3276; H01L 27/3297; H01L 51/0097; H01L 51/5253; H01L 51/5256; H01L 23/3107–3135; H01L 2251/5338; H01L 27/326; H01L 33/52; H01L 33/54; H01L 33/44
See application file for complete search history.

(56) References Cited

U.S. PATENT DOCUMENTS

| | | | |
|---|---|---|---|
| 2006/0093758 A1 | 5/2006 | Sakakura et al. | |
| 2007/0045621 A1 | 3/2007 | Suzuki et al. | |
| 2009/0153042 A1 | 6/2009 | Izumi et al. | |
| 2010/0019654 A1 | 1/2010 | Hayashi | |
| 2010/0117072 A1* | 5/2010 | Ofuji | H01L 27/3244 257/43 |
| 2010/0196679 A1 | 8/2010 | Morishima | |
| 2012/0319141 A1 | 12/2012 | Kim | |
| 2013/0099658 A1* | 4/2013 | Tsai | H01L 51/0097 313/504 |
| 2014/0034994 A1 | 2/2014 | Yamane et al. | |
| 2014/0246685 A1 | 9/2014 | Miura et al. | |
| 2014/0306211 A1 | 10/2014 | Okuyama et al. | |
| 2015/0037916 A1 | 2/2015 | Rohatgi | |
| 2015/0303402 A1 | 10/2015 | Yoshikawa et al. | |
| 2016/0028043 A1 | 1/2016 | Kwon et al. | |

FOREIGN PATENT DOCUMENTS

| | | |
|---|---|---|
| JP | 2006-44231 A | 2/2006 |
| JP | 2007-299662 A1 | 11/2007 |
| JP | 2009-37798 A | 2/2009 |
| JP | 2009-164107 A1 | 7/2009 |
| JP | 2010503238 A1 | 1/2010 |
| JP | 2011-138635 A1 | 7/2011 |
| JP | 2012-186170 A | 9/2012 |
| JP | 2013-168575 A1 | 8/2013 |
| JP | 2014-89825 A | 5/2014 |
| JP | 2014-170686 A1 | 9/2014 |
| WO | 2008/030960 A2 | 3/2008 |
| WO | 2013/046545 A1 | 4/2013 |
| WO | 2013/073302 A1 | 5/2013 |
| WO | 2013/046545 A1 | 4/2014 |

* cited by examiner

LIGHT-EMITTING DEVICE COMPRISING FLEXIBLE SUBSTRATE AND LIGHT-EMITTING ELEMENT

CROSS REFERENCE TO RELATED APPLICATION

This application is a Divisional Application of U.S. application Ser. No. 14/988,855, filed Jan. 6, 2016, which claims priority to Japanese Patent Application No. 2015-005353, filed Jan. 14, 2015, the entire contents of which are hereby incorporated by reference.

BACKGROUND

1. Technical Field

The present disclosure relates to a light-emitting device, specifically, a light-emitting device having flexibility.

2. Description of the Related Art

As light-emitting devices having flexibility, for example, organic electroluminescent (EL) displays having flexibility are known. The organic EL displays having flexibility are configured such that the displays can be wound or bent, and some of them have been put in practical use, for example, as the display of a smart phone.

The light-emitting devices such as an organic EL display have low water resistance and therefore have sealing structures for preventing the intrusion of water from the outside. The flexible base material used in a flexible light-emitting device may be, for example, thin glass, plastic, or metal foil. In particular, a plastic flexible base material has a high water vapor transmission and is therefore provided with a barrier layer for preventing the intrusion of water.

For example, Japanese Unexamined Patent Application Publication No. 2009-164107 discloses an organic EL display in which the infiltration of water is prevented by covering all of a plurality of organic EL elements with a protective film composed of a resin protective film and an inorganic protective film.

Recently, light-emitting devices have been required to be further improved in flexibility, and expandable and contractible light-emitting devices having stretchability have been demanded.

For example, Japanese Unexamined Patent Application Publication (Translation of PCT Application) No. 2010-503238 discloses a stretchable component having a first end and a second end each bonded to a substrate and having a bending portion at least in a part of the central region between the first end and the second end for providing an electronic device that is deformable, e.g., bendable, expandable, or contractible.

In addition, for example, Japanese Unexamined Patent Application Publication No. 2013-168575 discloses a stretchable circuit substrate including an organic thin-film transistor element.

SUMMARY

In one general aspect, the techniques disclosed here feature a light-emitting device including a flexible substrate, a lower barrier layer positioned above the flexible substrate, a first light-emitting element and a second light-emitting element positioned above the lower barrier layer, a first upper barrier layer positioned above the first light-emitting element and including a first inorganic material, and a second upper barrier layer positioned above the second light-emitting element and including a second inorganic material, where the first upper barrier layer and the second upper barrier layer are spaced from each other at least in a region between the first light-emitting element and the second light-emitting element.

In another general aspect, the techniques disclosed here feature a light-emitting device including a flexible substrate, a lower barrier layer positioned above the flexible substrate, a light-emitting element and a thin-film transistor controlling the light-emitting element positioned above the lower barrier layer, a first upper barrier layer positioned above the light-emitting element and including a first inorganic material, and a second upper barrier layer positioned above the thin-film transistor and including a second inorganic material, where the first upper barrier layer and the second upper barrier layer are spaced from each other at least in a region between the light-emitting element and the thin-film transistor.

In the present disclosure, the first upper barrier layer and the second upper barrier layer are spaced from each other in a region between circuit elements (e.g., between a first light-emitting element and a second light-emitting element or between a light-emitting element and a thin-film transistor). Consequently, the rigidity in this spacing region of the light-emitting device can be reduced. Accordingly, the light-emitting device, when it is bent or expanded or contracted, tends to be bent or expanded or contracted selectively at the spacing region having a low rigidity, which can prevent cracking of the barrier layer. In addition, the barrier layer can prevent the light-emitting device, when it is bent or expanded or contracted, from being damaged. It is therefore possible to provide a light-emitting device with high reliability.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1A:
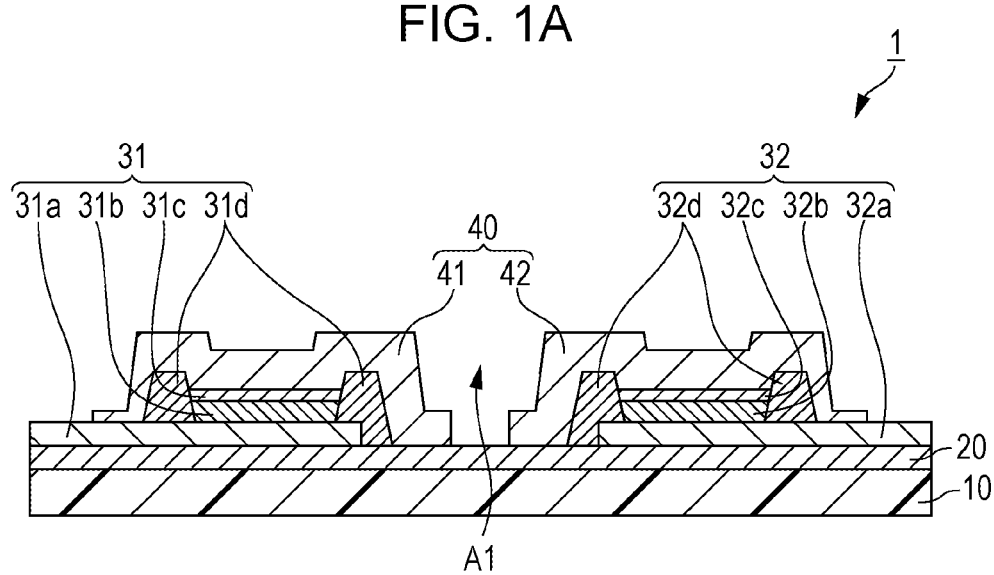
FIG. 1A is a cross-sectional view schematically illustrating the configuration of a light-emitting device according to Embodiment 1.

Underlying Knowledge Forming Basis of the Present Disclosure

Development processes leading to one aspect of the present disclosure will now be described prior to specific description of aspects of the present disclosure.

The present inventors have found that the above-described light-emitting device having flexibility causes the following problems.

A light-emitting device including a plurality of light-emitting elements is provided with barrier layers at the top and the bottom for sealing all of the light-emitting elements. For example, the organic EL display described in Japanese Unexamined Patent Application Publication No. 2009-164107 includes an inorganic protective film formed as a barrier layer in the entire display region.

Many of such barrier layers are made of relatively hard materials. Accordingly, bending of a light-emitting device applies a stress to the barrier layer positioned above or below the light-emitting element, which may cause breakage of the barrier layer. In addition, in an expandable and contractible light-emitting device, the barrier layer is readily broken by expansion or contraction. The breakage of the barrier layer causes a problem, deterioration of the light-emitting element due to infiltration of water from the crack of the barrier layer, resulting in deterioration of the light-emitting device.

For example, in the organic EL display described in Japanese Unexamined Patent Application Publication No. 2009-164107, the inorganic protective film (barrier layer) is broken when the display is expanded or contracted, resulting in deterioration of the inner organic EL element due to infiltration of water from the cracking region of the inorganic protective film.

In particular, in the organic EL display described in Japanese Unexamined Patent Application Publication No. 2009-164107, since the inorganic protective film (barrier layer) is present in the entire display region, it cannot be ascertained whether the inorganic protective film is cracked at a portion directly below an organic EL element or at a portion not under an organic EL element. If the cracking of the inorganic protective film occurs at a portion directly below an organic EL element, the intrusion of water from the crack starts immediately after the occurrence of the cracking, and the water reaches the organic EL element to enhance the deterioration of the organic EL element or causes poor emission of the organic EL element.

It has been furthermore found that even if the barrier layers positioned above and below the light-emitting element are not broken, the barrier layers are deformed when the light-emitting device is bent or expanded or contracted and that this deformation of the barrier layers applies a stress to the light-emitting element to cause a problem of damaging the light-emitting element itself.

For example, in the organic EL display described in Japanese Unexamined Patent Application Publication No. 2009-164107, the inorganic protective films positioned above and below the light-emitting element are deformed when the organic EL display is bent or expanded or contracted. This deformation of the inorganic protective films applies a stress to the organic EL element to damage the organic EL element, resulting in breakage or cracking of the element.

The present disclosure was made based on these findings and provides a light-emitting device in which barrier layers positioned above and below a light-emitting element are prevented from cracking, and the light-emitting element itself is prevented from being damaged.

One aspect of a light-emitting device according to the present disclosure includes a flexible substrate, a lower barrier layer positioned above the flexible substrate, a first light-emitting element and a second light-emitting element positioned above the lower barrier layer, a first upper barrier layer positioned above the first light-emitting element and including a first inorganic material, and a second upper barrier layer positioned above the second light-emitting element and including a second inorganic material, where the first upper barrier layer and the second upper barrier layer are spaced from each other at least in a region between the first light-emitting element and the second light-emitting element. The first upper barrier layer may include the first inorganic material as a main component. The second upper barrier layer may include the second inorganic material as a main component. The component having barrier property in the first upper barrier layer may be the first inorganic material. The component having barrier property in the second upper barrier layer may be the second inorganic material. The first upper barrier layer may be composed of the first inorganic material. The second upper barrier layer may be composed of the second inorganic material.

In this aspect, since the first upper barrier layer and the second upper barrier layer are spaced from each other in a region between the first light-emitting element and the second light-emitting element, the rigidity of the light-emitting device in a first spacing region, which is the region between the first upper barrier layer and the second upper barrier layer, can be lower than those of the first upper barrier layer and the second upper barrier layer. Accordingly, when the light-emitting device is deformed by bending, expanding, or contracting, the first spacing region having a low rigidity can be selectively deformed without deforming the first upper barrier layer and the second upper barrier layer above the first light-emitting element and the second light-emitting element and the lower barrier layer below the first light-emitting element and the second light-emitting element. Therefore, the light-emitting device can prevent all the barrier layers (the first upper barrier layer, the second upper barrier layer, and the lower barrier layer) from cracking, while having stretchability as a whole, and can prevent the expansion and contraction of the first light-emitting element and the second light-emitting element to prevent the first light-emitting element and the second light-emitting element themselves from being damaged. As a result, a light-emitting device with high reliability can be provided.

In one aspect of a light-emitting device according to the present disclosure, the device may further include a first organic material disposed between the first upper barrier layer and the second upper barrier layer.

In general, since organic materials have a lower rigidity than those of inorganic materials. Accordingly, in the light-emitting device in this aspect, a first spacing region, which is the region between the first upper barrier layer and the second upper barrier layer, can have a rigidity lower than those of the first upper barrier layer and the second upper barrier layer. In this aspect, since an organic material is disposed in the first spacing region, it is possible to prevent intrusion of water from the end of the first upper barrier layer and the end of the second upper barrier layer. Consequently, the reliability is further improved.

In one aspect of a light-emitting device according to the present disclosure, the lower barrier layer may include a third inorganic material. The lower barrier layer may include the third inorganic material as a main component. The component having barrier property in the lower barrier layer may be the third inorganic material. The lower barrier layer may be composed of the third inorganic material.

In this aspect, intrusion of water from the flexible substrate into the first light-emitting element and the second light-emitting element can be effectively prevented.

In one aspect of a light-emitting device according to the present disclosure, the lower barrier layer may include a first lower barrier layer and a second lower barrier layer spaced from each other. The first light-emitting element may be positioned above the first lower barrier layer, whereas the second light-emitting element may be positioned above the second lower barrier layer.

In this aspect, the first lower barrier layer and the second lower barrier layer are spaced from each other in a region corresponding to the region between the first light-emitting element and the second light-emitting element. Accordingly, in the light-emitting device, a second spacing region, which is the region between the first lower barrier layer and the second lower barrier layer, can have a rigidity lower than those of the first lower barrier layer and the second lower barrier layer. The light-emitting device can therefore improve the stretchability as a whole without causing cracking of the barrier layers and damaging the light-emitting elements.

In one aspect of a light-emitting device according to the present disclosure, the device may further include a second organic material disposed between the first lower barrier layer and the second lower barrier layer.

In this aspect, since an organic material is disposed in the second spacing region, it is possible to prevent intrusion of water from the end of the first lower barrier layer and the end of the second lower barrier layer. Consequently, a further improvement in the reliability can be expected.

In one aspect of a light-emitting device according to the present disclosure, the device may further include a first wiring disposed between the first lower barrier layer and the second lower barrier layer; the first light-emitting element and the second light-emitting element each may include a first electrode, a second electrode facing the first electrode, and a light-emitting layer positioned between the first electrode and the second electrode; and the first wiring may connect the first electrode of the first light-emitting element and the first electrode of the second light-emitting element.

In this aspect, since the first electrodes of the first light-emitting element and the second light-emitting element are connected to each other with the first wiring and are thereby common to the elements, a single power source can supply electricity to the first light-emitting element and the second light-emitting element.

In one aspect of a light-emitting device according to the present disclosure, in each of the first light-emitting element and the second light-emitting element, the first electrode, the light-emitting layer, and the second electrode may be disposed from the bottom to the top in this order. The first light-emitting element and the second light-emitting element may further include a first planarizing layer between the first electrode of the first light-emitting element and the first lower barrier layer and a second planarizing layer between the first electrode of the second light-emitting element and the second lower barrier layer.

In this aspect, the first planarizing layer and the second planarizing layer can planarize the underlayer of the first electrode of the first light-emitting element and the underlayer of the first electrode of the second light-emitting element and can thereby planarize the first electrodes. Consequently, the first light-emitting element and the second light-emitting element can more uniformly emit light.

In one aspect of a light-emitting device according to the present disclosure, the first upper barrier layer and the second upper barrier layer may be connected to the lower barrier layers directly or via an inorganic insulating layer at the side surfaces of the first light-emitting element and the second light-emitting element.

In this aspect, not only the top and bottom but also the side surface of the first light-emitting element can be covered by the first upper barrier layer and the lower barrier layer. Similarly, not only the top and bottom but also the side surface of the second light-emitting element can be covered by the second upper barrier layer and the lower barrier layer. Consequently, the intrusion of water from the side surface portions of the first light-emitting element and the second light-emitting element can be prevented. Therefore, the reliability is further improved.

In one aspect of a light-emitting device according to the present disclosure, the device may further include a sealing resin covering the first upper barrier layer and the second upper barrier layer.

In this aspect, the intrusion of water from the outside can be further prevented. In addition, the stress applied to the first upper barrier layer and the second upper barrier layer when the light-emitting device is deformed can be dispersed and relieved. As a result, a further improvement in the reliability can be expected.

In one aspect of a light-emitting device according to the present disclosure, the device may further include an upper substrate disposed on the sealing resin and facing the flexible substrate.

In this aspect, the upper substrate covering the whole can further prevent the intrusion of water. In addition, the stress applied to the first upper barrier layer and the second upper barrier layer when the light-emitting device is deformed can be further relieved. As a result, a further improvement in the reliability can be expected.

In one aspect of a light-emitting device according to the present disclosure, the device may further include a thin-film transistor disposed below at least one selected from the group of the first light-emitting element and the second light-emitting element and include a passivation layer covering the thin-film transistor.

In this aspect, the reliability of the thin-film transistor (TFT) is improved by once covering the TFT with the passivation layer.

In this case, the passivation layer may be connected directly or via a metal material or a fourth inorganic material to at least one selected from the group of the first upper barrier layer, the second upper barrier layer, and the lower barrier layer.

In this aspect, since the passivation layer can cover not only the upper surface but also the side surface of the thin-film transistor, the intrusion of water from the side surface portion of the thin-film transistor can be prevented. Consequently, an improvement in the reliability of the light-emitting device can be expected.

In one aspect of a light-emitting device according to the present disclosure, the shape of the first wiring in a planar view may include at least one selected from the group of a curving portion and a bending portion. The first wiring in a planar view may have a meander shape or a zigzag shape.

In this aspect, in the second spacing region, which is an easily expanding and contracting region, the first wiring easily deforms when the light-emitting device is deformed, resulting in prevention of disconnection of the first wiring.

In one aspect of a light-emitting device according to the present disclosure, the first wiring may have a concave portion and a convex portion in a sectional view.

In this aspect, the stress to the first wiring can be relieved. Consequently, disconnection of the first wiring when the light-emitting device is deformed can be prevented.

In one aspect of a light-emitting device according to the present disclosure, the device may further include a second wiring striding across an end of the lower barrier layer, and the end of the lower barrier layer may have a forward tapered shape.

In this aspect, the concentration of stress to the second wiring at the end of the lower barrier layer can be relieved. Consequently, disconnection of the second wiring can be prevented.

In one aspect of a light-emitting device according to the present disclosure, the device may further include an intervening layer having a forward tapered shape and disposed between the second wiring and the end of the lower barrier layer.

In this aspect, the concentration of stress to the second wiring at the end of the lower barrier layer can be relieved. Consequently, disconnection of the second wiring can be prevented.

In one aspect of a light-emitting device according to the present disclosure, the first wiring may contain at least one selected from the group consisting of aluminum, silver, copper, electroconductive polymers, and carbon nanotubes.

In this aspect, since the first wiring can easily expand in the second spacing region allowing easy expansion and contraction, disconnection of the first wiring when the light-emitting device is deformed can be prevented.

In one aspect of a light-emitting device according to the present disclosure, the device may further include a first common barrier layer covering both the first light-emitting element and the second light-emitting element.

In this aspect, since the first common barrier layer covers both the first light-emitting element and the second light-emitting element, the intrusion of water from the top can be prevented. Accordingly, a further improvement in the reliability can be expected.

In one aspect of a light-emitting device according to the present disclosure, the device may further include a second common barrier layer common to the first light-emitting element and the second light-emitting element and disposed between the flexible substrate and the lower barrier layer.

In this aspect, the intrusion of water from the bottom, i.e., from the flexible substrate side can be prevented. Accordingly, a further improvement in the reliability can be expected.

In this case, the device may further include an insulating resin layer disposed between the second common barrier layer and the lower barrier layer.

In this aspect, even if the second common barrier layer is cracked by deformation of the light-emitting device, the presence of the insulating resin layer can prevent influence of the water intruding from the crack of the second common barrier layer on the upper layer.

In addition, in another aspect of a light-emitting device according to the present disclosure, the device includes a flexible substrate, a lower barrier layer positioned above the flexible substrate, a light-emitting element and a thin-film transistor controlling the light-emitting element positioned above the lower barrier layer, a first upper barrier layer positioned above the light-emitting element and including a first inorganic material, and a second upper barrier layer positioned above the thin-film transistor and including a second inorganic material, where the first upper barrier layer and the second upper barrier layer are spaced from each other at least in a region between the light-emitting element and the thin-film transistor.

In this aspect, since the first upper barrier layer and the second upper barrier layer are spaced from each other in a region corresponding to the region between the light-emitting element and the thin-film transistor, the rigidity of the light-emitting device in a first spacing region, which is the region between the first upper barrier layer and the second upper barrier layer, can be lower than those of the first upper barrier layer and the second upper barrier layer. Accordingly, when the light-emitting device is deformed by bending, expanding, or contracting, the first spacing region having a low rigidity can be selectively deformed. Therefore, the light-emitting device can prevent all the barrier layers (the first upper barrier layer, the second upper barrier layer, and the lower barrier layer) from cracking, while having stretchability as a whole, and can prevent the expansion and contraction of the thin-film transistor and the light-emitting element to thereby prevent the thin-film transistor and the light-emitting element themselves from being damaged. In addition, the isolation between the thin-film transistor and the light-emitting element can prevent deterioration by emission gas from the inside. As a result, a light-emitting device with high reliability can be provided.

In another aspect of a light-emitting device according to the present disclosure, the lower barrier layer may include a first lower barrier layer and a second lower barrier layer spaced from each other, wherein the light-emitting element may be positioned above the first lower barrier layer, and the thin-film transistor may be positioned above the second lower barrier layer.

In this aspect, since the first lower barrier layer and the second lower barrier layer are spaced from each other in a region corresponding to the region between the light-emitting element and the thin-film transistor, the rigidity of the light-emitting device in a second spacing region, which is the region between the first lower barrier layer and the second lower barrier layer, can be lower than those of the first lower barrier layer and the second lower barrier layer. The light-emitting device can therefore improve the stretchability as a whole without causing cracking of the barrier layers and damaging the light-emitting elements.

In another aspect of a light-emitting device according to the present disclosure, the device may further include a connection wiring connecting the light-emitting element and the thin-film transistor (TFT).

In this aspect, since the light-emitting element and the TFT are connected with the connection wiring, the light-emitting element can be controlled through the TFT.

In another aspect of a light-emitting device according to the present disclosure, the device may further include a first passivation layer disposed between the light-emitting element and the lower barrier layer and a second passivation layer disposed above the thin-film transistor, wherein the first passivation layer and the second passivation layer may be made of the same material and may have the same thickness.

In this aspect, the passivation layer having a barrier property can be formed below the light-emitting element and also above the thin-film transistor by a single process. Consequently, the barrier properties of the light-emitting element and the thin-film transistor can be improved without increasing the number of processes.

In one aspect and another aspect of a light-emitting device according to the present disclosure, the device may further include a planarizing layer disposed directly below at least one selected from the group of the first upper barrier layer and the second upper barrier layer.

In this aspect, the planarizing layer absorbs the irregularity generated by the formation of the light-emitting element or the thin-film transistor and planarizes the surface. Consequently, the concentration of stress to the first upper barrier layer and the second upper barrier layer in deformation of the light-emitting device can be relieved, and a light-emitting device with high reliability can be provided.

EMBODIMENTS

Embodiments of the present disclosure will now be described with reference to the drawings. The Embodiments described below are all mere examples. For example, the numerical values, shapes, materials, components, and arrangement positions and connection configurations of the components shown in the following Embodiments are mere examples and are not intended to limit the present disclosure. Accordingly, among the components in the following Embodiments, components that are not mentioned in the independent claims describing the broadest concept of the present disclosure will be described as optional components.

Incidentally, each drawing is a schematic diagram and does not necessarily strictly illustrate. In each drawing, substantially the same constituting members are denoted by the same reference symbols and duplicate explanation will not be given.

Embodiment 1

Figure 1B:
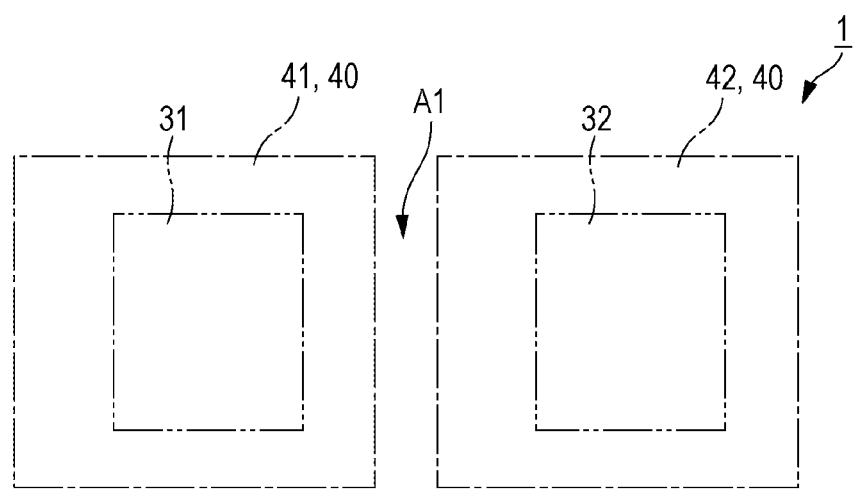
FIG. 1B is a plan view schematically illustrating the configuration of the light-emitting device according to Embodiment 1.

A light-emitting device 1 according to Embodiment 1 will be described with reference to FIGS. 1A and 1B. FIG. 1A is a cross-sectional view schematically illustrating the configuration of a light-emitting device 1 according to Embodiment 1, and FIG. 1B is a plan view schematically illustrating the configuration of the light-emitting device 1.

As shown in FIG. 1A, the light-emitting device 1 according to the Embodiment is a top emission type light-emitting device having flexibility including light-emitting elements on a flexible base material. The device 1 includes a flexible substrate 10 having flexibility, a lower barrier layer 20 positioned on the flexible substrate 10, a first light-emitting element 31 and a second light-emitting element 32 positioned on the lower barrier layer 20, and a upper barrier layer 40 positioned on the first light-emitting element 31 and the second light-emitting element 32.

The upper barrier layer 40 is divided corresponding to a first light-emitting element 31 and a second light-emitting element 32. As shown in FIGS. 1A and 1B, the upper barrier layer 40 according to this Embodiment is composed of a first upper barrier layer 41 positioned on the first light-emitting element 31 and a second upper barrier layer 42 positioned on the second light-emitting element 32.

The first upper barrier layer 41 and the second upper barrier layer 42 are spaced from each other at least in a region between the first light-emitting element 31 and the second light-emitting element 32. That is, the first upper barrier layer 41 and the second upper barrier layer 42 are disconnected to each other in a region between the first light-emitting element 31 and the second light-emitting element 32.

In this Embodiment, the first upper barrier layer 41 and the second upper barrier layer 42 seal the first light-emitting element 31 and the second light-emitting element 32, respectively. Specifically, the first upper barrier layer 41 is formed above the lower barrier layer 20 so as to cover the entire first light-emitting element 31, whereas the second upper barrier layer 42 is formed above the lower barrier layer 20 so as to cover the entire second light-emitting element 32. That is, the first upper barrier layer 41 and the second upper barrier layer 42 are completely spaced from each other without being in contact with each other.

The first spacing region A1, in which the first upper barrier layer 41 and the second upper barrier layer 42 are spaced from each other, has a rigidity lower than those of the first upper barrier layer 41 and the second upper barrier layer 42. In this Embodiment, air (an air layer) is present in the first spacing region A1 as a material having a rigidity lower than those of the upper barrier layer 41 and the second upper barrier layer 42.

Each constituting member of the light-emitting device 1 according to this Embodiment will now be described in detail. In this Embodiment, the term "barrier layer (barrier film) having a barrier property" refers to, for example, that the water vapor transmission of a single film is 1 g or less.

[Flexible Substrate]

The flexible substrate 10 is a flexible base material having not only flexibility but also stretchability. The flexible substrate 10 is, for example, a resin (plastic) sheet or film made of a polymer material, such as polyimide, polyethylene naphthalate, polycarbonate, a cycloolefin polymer, polyamide, polyurethane, polyethylene, polypropylene, polyvinyl chloride, or polyethylene terephthalate.

The material for the flexible substrate 10 is not limited to polymer materials. The flexible substrate 10 may be any substrate having flexibility and stretchability and may be a translucent substrate or a nontranslucent substrate.

[Lower Barrier Layer]

The lower barrier layer 20 is a barrier film (sealing film) having a barrier property preventing the intrusion of water, and is formed on the flexible substrate 10 in a prescribed shape. In this Embodiment, the lower barrier layer 20 is disposed between the flexible substrate 10 and the first light-emitting element 31/the second light-emitting element 32. Accordingly, the lower barrier layer 20 prevents water and oxygen passed through the flexible substrate 10 from intruding into the first light-emitting element 31 and the second light-emitting element 32.

The lower barrier layer 20 is an inorganic sealing film made of a material mainly composed of an inorganic material. The lower barrier layer 20 mainly composed of an inorganic material can effectively prevent water from intruding from the flexible substrate 10 into the first light-emitting element 31 and the second light-emitting element 32.

The inorganic material for the lower barrier layer 20 can be a silicon material, such as silicon nitride (SiN), silicon oxinitride (SiON), silicon oxide (SiO), or silicon carbide (SiC), or an aluminum material, such as aluminum oxide ($Al_2O_3$).

The material for the lower barrier layer 20 is not limited to these materials and may be a metal oxide material or a semiconductor oxide material. In addition, the lower barrier layer 20 may have, instead of a single layer structure, a layered structure. In such a case, the lower barrier layer 20 is not limited to those made of inorganic materials only and may be a laminated film of an inorganic material and a metal oxide material, a laminated film of an inorganic material and a semiconductor oxide material, or a laminated film of an inorganic material and an organic material. For example, the lower barrier layer 20 may be a laminated film composed of an inorganic film, an organic film, an organic film, and an inorganic film in this order, but the order and the materials of the films are not limited to this.

[Light-Emitting Element]

The first light-emitting element 31 is, for example, an organic EL element and at least includes a first electrode 31a, a light-emitting layer 31b, and a second electrode 31c. The first light-emitting element 31 has a layered structure composed of the first electrode 31a, the light-emitting layer 31b, and the second electrode 31c from the bottom to the top in this order.

The first electrode 31a is formed on the lower barrier layer 20. The second electrode 31c is positioned so as to face the first electrode 31a. The light-emitting layer 31b is positioned between the first electrode 31a and the second electrode 31c. The first light-emitting element 31 according to this Embodiment further includes a partition wall 31d partitioning the light-emitting layer 31b.

Similarly, the second light-emitting element 32 is, for example, an organic EL element and at least includes a first electrode 32a, a light-emitting layer 32b, and a second electrode 32c. The second light-emitting element 32 has a layered structure composed of the first electrode 32a, the light-emitting layer 32b, and the second electrode 32c from the bottom to the top in this order.

The first electrode 32a is formed on the lower barrier layer 20. The second electrode 32c is positioned so as to face the first electrode 32a. The light-emitting layer 32b is positioned between the first electrode 32a and the second electrode 32c. The second light-emitting element 32 according to this Embodiment further includes a partition wall 32d partitioning the light-emitting layer 32b.

The first electrodes 31a and 32a are anodes (positive electrodes). The first electrodes 31a and 32a each have a single layer structure or a multilayer structure of, for example, an electroconductive material or its alloy, such as molybdenum (Mo), aluminum (Al), copper (Cu), tungsten (W), tantalum (Ta), niobium (Nb), nickel (Ni), titanium (Ti), chromium (Cr), or molybdenum tungsten (MoW). The first electrodes 31a and 32a each have a thickness of, for example, about 20 to 500 nm. The materials for the first electrodes 31a and 32a are not limited to these materials and may be other metal materials, such as metal oxides (e.g., indium tin oxide (ITO)), or other materials, such as electroconductive polymers, carbon nanotubes, silver paste, or silver nanowire. That is, the first electrodes 31a and 32a may be each made of any electroconductive material and may each have a layered structure made of the above-mentioned materials.

The light-emitting layers 31b and 32b each are made of an organic material and an inorganic material and have a structure functionally separated into, for example, a hole-injecting layer, a hole-transporting layer, an EL layer, an electron-transporting layer, and an electron-injecting layer. The structures of the light-emitting layers 31b and 32b are not limited to this and may not functionally separated as long as light is emitted.

The second electrodes 31c and 32c are cathodes (negative electrodes). The second electrodes 31c and 32c each have a single layer structure or a multilayer structure of, for example, an electroconductive material or its alloy, such as a transparent electroconductive film of magnesium (Mg), aluminum (Al), lithium (Li), silver (Ag), barium (Ba), indium tin oxide (ITO), indium zinc oxide (IZO), etc., or an electroconductive polymer, such as PEDOT. The second electrodes 31c and 32c each have a thickness of, for example, about 4 to 20 nm. The materials for the second electrodes 31c and 32c are not limited to these materials and may be other metal materials, metal oxides, or electroconductive polymers or may be materials, such as carbon nanotubes, silver paste, or silver nanowire. That is, the second electrodes 31c and 32c may be each made of any electroconductive material and may each have a layered structure made of the above-mentioned materials. Since the light-emitting device 1 according to this Embodiment has, however, a top emission structure, the second electrodes 31c and 32c are required to be transparent or semi-transparent. The transparent or semi-transparent second electrodes 31c and 32c can be prepared by selecting the materials or adjusting the film thicknesses.

The partition walls (banks) 31d and 32d are formed on the first electrodes 31a and 32a, respectively, to define the respective light-emitting regions (light-emitting layers 31b and 32b) of the first light-emitting element 31 and the second light-emitting element 32. The partition walls 31d and 32d are each formed by, for example, an insulating material, specifically, an organic material, such as polyimide or acryl, or an inorganic material, such as silicon oxide ($SiO_2$) or aluminum oxide ($Al_2O_3$). The materials of the partition walls 31d and 32d are not limited to these materials and may be any material having insulating properties. The partition walls 31d and 32d may be each made of a hybrid material of an organic material and an inorganic material or may be a laminated film of insulating films.

The definition of the light-emitting regions (light-emitting layers) by the partition walls 31d and 32d can improve the insulation properties of the circumferences of the light-emitting regions and can prevent the short circuit between the first electrode 31a (32a) and the second electrode 31c (32c). The definition of the light-emitting regions by the partition walls 31d and 32d can increase the degree of freedom in the emission mode, which allows freer display, such as character display.

In order to prevent the stepwise break of each of the second electrodes 31c and 32c at a stepped part of the underlayer, the cross-sections of the partition walls 31d and 32d may be each a forward tapered shape, as shown in FIG. 1A. Here, the term "forward tapered shape" refers to a shape having a cross-sectional structure having a narrow upper side (top face) and a broad bottom side (bottom face), such as a trapezoid shape or a hog-backed shape, when the emission side of the top emission structure is placed on the upper side.

[Upper Barrier Layer]

The upper barrier layer 40 is a barrier film (sealing film) having a barrier property preventing the intrusion of water. The first upper barrier layer 41 is formed on the first light-emitting element 31, and the second upper barrier layer 42 is formed on the second light-emitting element 32. Accordingly, the first upper barrier layer 41 prevents water and oxygen from the top from intruding into the first light-emitting element 31, and the second upper barrier layer 42 prevents water and oxygen from the top from intruding into the second light-emitting element 32.

The first upper barrier layer 41, among the inorganic sealing layers disposed on the first light-emitting element 31, is nearest to the first light-emitting element 31. That is, the first upper barrier layer 41 covers the first light-emitting element 31 so as to be in contact with the first light-emitting element 31. Specifically, the first upper barrier layer 41 is in contact with the second electrode 31c of the first light-emitting element 31.

Similarly, the second upper barrier layer 42, among the inorganic sealing layers disposed on the second light-emitting element 32, is nearest to the second light-emitting element 32. That is, the second upper barrier layer 42 covers the second light-emitting element 32 so as to be in contact with the second light-emitting element 32. Specifically, the second upper barrier layer 42 is in contact with the second electrode 32c of the second light-emitting element 32.

The first upper barrier layer 41 and the second upper barrier layer 42 are directly connected to the lower barrier layer 20 in the regions surrounding the first light-emitting element 31 and the second light-emitting element 32. Specifically, the peripheral end of the first upper barrier layer 41 is in contact with the lower barrier layer 20 in the region surrounding the first light-emitting element 31. The peripheral end of the second upper barrier layer 42 is in contact with the lower barrier layer 20 in the region surrounding the second light-emitting element 32.

The first upper barrier layer 41 and the second upper barrier layer 42 may be connected to the lower barrier layer 20 via an inorganic insulating layer in the regions surrounding the first light-emitting element 31 and the second light-emitting element 32.

Thus, the direct or indirect connection of the first upper barrier layer 41 and the second upper barrier layer 42 to the lower barrier layer 20 allows not only the top and the bottom portions, but also the side surface portion, of the first light-emitting element 31 to be covered with the first upper barrier layer 41 and the lower barrier layer 20 and allows not only the top and the bottom portions, but also the side surface portion, of the second light-emitting element 32 to be covered with the second upper barrier layer 42 and the lower barrier layer 20. As a result, the intrusion of water from the side surface portions of the first light-emitting element 31 and the second light-emitting element 32 can be prevented.

The first upper barrier layer 41 and the second upper barrier layer 42 are inorganic sealing films mainly composed of inorganic materials. The inorganic materials of the first upper barrier layer 41 and the second upper barrier layer 42 can be each a silicon material, such as silicon nitride (SiN), silicon oxinitride (SiON), silicon oxide (SiO), or silicon carbide (SiC), or an aluminum material, such as aluminum oxide ($Al_2O_3$).

The materials of the first upper barrier layer 41 and the second upper barrier layer 42 are not limited to these materials and may be metal oxide materials or semiconductor oxide materials. In addition, the first upper barrier layer 41 and the second upper barrier layer 42 may have, instead of a single layer structure, a layered structure. In such a case, the first upper barrier layer 41 and the second upper barrier layer 42 are not limited to those made of inorganic materials only and may be laminated films each of an inorganic material and a metal oxide material or of an inorganic material and a semiconductor oxide material, or a laminated film of an inorganic material and an organic material. For example, the first upper barrier layer 41 and the second upper barrier layer 42 may be each a laminated film composed of an inorganic film, an organic film, an organic film, and an inorganic film in this order, but the order and the materials of the films are not limited to this. The material of the first upper barrier layer 41 and the material of the second upper barrier layer 42 may be the same or different.

[Advantageous Effects]

As described above, in the light-emitting device 1 according to this Embodiment, the first upper barrier layer 41 and the second upper barrier layer 42 are spaced from each other in a region between the first light-emitting element 31 and the second light-emitting element 32. This first spacing region A1 where the first upper barrier layer 41 and the second upper barrier layer 42 are spaced from each other has a rigidity lower than those of the first upper barrier layer 41 and the second upper barrier layer 42.

As a result, when the light-emitting device 1 is deformed by bending, expanding, or contracting, the first spacing region A1 having a low rigidity between the first upper barrier layer 41 and the second upper barrier layer 42 can be selectively deformed without deforming the upper barrier layer 40 (the first upper barrier layer 41 and the second upper barrier layer 42) itself on the first light-emitting element 31 and the second light-emitting element 32 and also without deforming the lower barrier layer itself below the first light-emitting element 31 and the second light-emitting element 32.

Accordingly, the light-emitting device 1 as a whole can prevent the upper barrier layer 40 and the lower barrier layer 20 from cracking, while having stretchability, and prevent the expansion and contraction of the first light-emitting element 31 and the second light-emitting element 32 to prevent the first light-emitting element 31 and the second light-emitting element 32 themselves from being damaged. As a result, a light-emitting device with high reliability can be provided.

Thus, the upper barrier layer 40 and the lower barrier layer 20 can be easily prevented from cracking, even if the upper barrier layer 40 and the lower barrier layer 20 are made of relatively hard materials, by providing the first spacing region A1 having a low rigidity.

In addition, the light-emitting device 1 according to this Embodiment is of a top emission type. Accordingly, for example, the upper electrodes, i.e., the second electrodes 31c and 32c, are connected to the electrodes (or wirings) formed in the same layer as that of the first electrodes 31a and 32a in the region including the first upper barrier layer 41 or the second upper barrier layer 42 and are extracted to the outside of the region where the first upper barrier layer 41 or the second upper barrier layer 42 is formed.

As a result, the second electrodes 31c and 32c can be connected to the electrodes (or wiring) formed in the same layer as that of the first electrodes 31a and 32a in a region near the first light-emitting element 31 and the second light-emitting element 32, respectively, even if the second electrodes 31c and 32c are made of materials having low water resistance or materials having high electrical resistance. Accordingly, since the second electrodes 31c and 32c can be prevented from being oxidized by water, an improvement in the reliability can be expected. Since the second electrodes 31c and 32c are connected to electrodes (or wiring) having low resistance, uniform light emission can be achieved.

The structure of the light-emitting device 1 is not limited to the top emission type and may be a bottom emission type. In such a case, the first electrodes 31a and 32a) are connected to the electrodes (or wirings) formed in the same layer as that of the second electrodes 31c and 32c in the region including the first upper barrier layer 41 or the second upper barrier layer 42 and are extracted to the outside of the region where the first upper barrier layer 41 or the second upper barrier layer 42 is formed.

As a result, the electrode having high resistance can be connected to the electrode (or wiring) formed in the same layer as that of the second electrode 32c in a region near the first light-emitting element 31 and the second light-emitting element 32, and uniform light emission can be achieved by the connection to an electrode (or wiring) having low resistance.

Embodiment 2

Figure 2A:
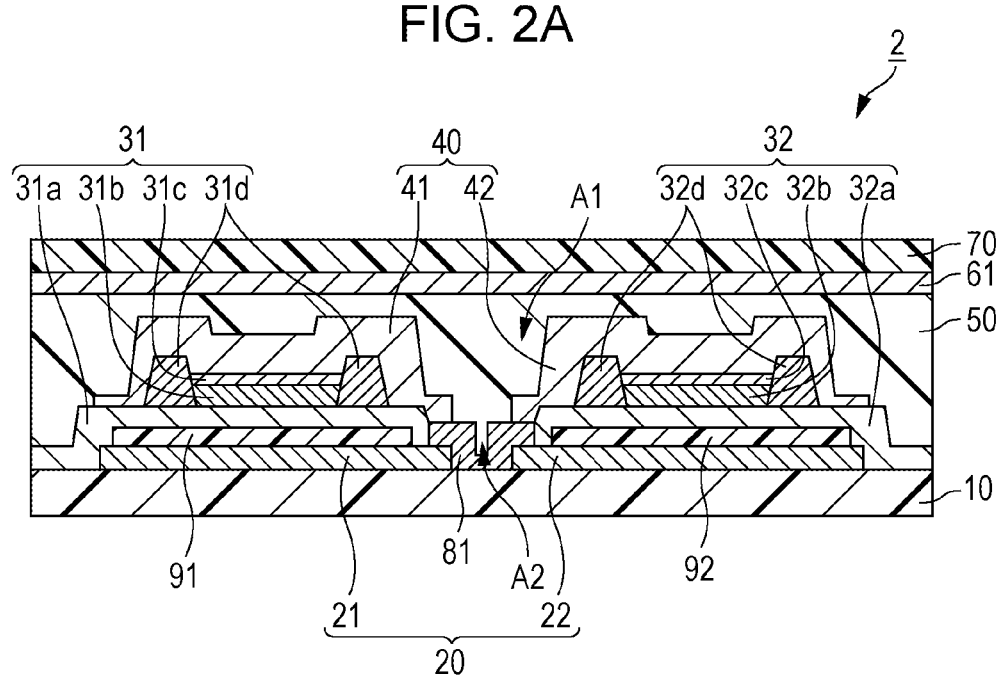
FIG. 2A is a cross-sectional view schematically illustrating the configuration of a light-emitting device according to Embodiment 2.
Figure 2B:
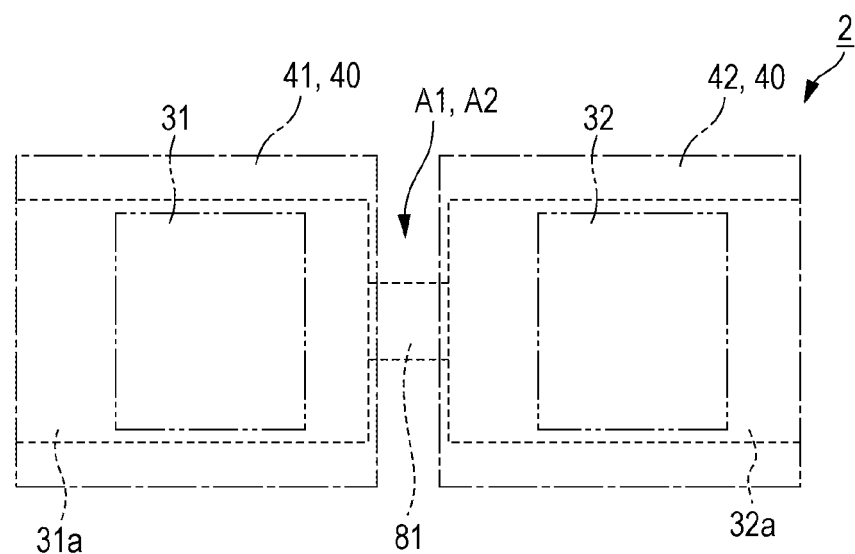
FIG. 2B is a plan view schematically illustrating the configuration of the light-emitting device according to Embodiment 2.

A light-emitting device 2 according to Embodiment 2 will be described with reference to FIGS. 2A and 2B. FIG. 2A is a cross-sectional view schematically illustrating the configuration of a light-emitting device 2 according to Embodiment 2, and FIG. 2B is a plan view schematically illustrating the configuration of the light-emitting device 2.

As shown in FIG. 2A, the light-emitting device 2 according to this Embodiment is, as in the light-emitting device 1 in Embodiment 1, a bottom emission type light-emitting device having flexibility including light-emitting elements on a flexible base material. The device 2 includes a flexible substrate 10, a lower barrier layer 20 positioned on the flexible substrate 10, a first light-emitting element 31 and a second light-emitting element 32 positioned on the lower barrier layer 20, and an upper barrier layer 40 positioned on the first light-emitting element 31 and the second light-emitting element 32.

In also this Embodiment, the upper barrier layer 40 is divided corresponding to a first light-emitting element 31 and a second light-emitting element 32. As shown in FIGS. 2A and 2B, the upper barrier layer 40 is composed of a first upper barrier layer 41 positioned on the first light-emitting element 31 and a second upper barrier layer 42 positioned on the second light-emitting element 32.

In also in this Embodiment, the first upper barrier layer 41 and the second upper barrier layer 42 are spaced from each other at least in a region corresponding to the region between the first light-emitting element 31 and the second light-emitting element 32 to seal the first light-emitting element 31 and the second light-emitting element 32, respectively.

In also in this Embodiment, the first spacing region A1, in which the first upper barrier layer 41 and the second upper barrier layer 42 are spaced from each other, has a rigidity lower than those of the first upper barrier layer 41 and the second upper barrier layer 42.

In this Embodiment, however, the first spacing region A1 is filled with a sealing resin 50, which is an organic material having a rigidity lower than those of the first upper barrier layer 41 and the second upper barrier layer 42. By filling the first spacing region A1 with the sealing resin 50 of an organic material, intrusion of water from the end of the first upper barrier layer 41 and the end of the second upper barrier layer 42 can be prevented.

In this Embodiment, the lower barrier layer 20 is divided corresponding to the first light-emitting element 31 and the second light-emitting element 32, whereas in Embodiment 1, the lower barrier layer 20 is not separated. The lower barrier layer 20, as shown in FIGS. 2A and 2B, includes a first lower barrier layer 21 and a second lower barrier layer 22 that are spaced from each other in the first spacing region A1. The first lower barrier layer 21 is positioned below the first light-emitting element 31, and the second lower barrier layer 22 is positioned below the second light-emitting element 32.

The first lower barrier layer 21 and the second lower barrier layer 22 are spaced from each other at least in a region corresponding to the region between the first light-emitting element 31 and the second light-emitting element 32. That is, the first lower barrier layer 21 and the second lower barrier layer 22 are disconnected to each other in a region corresponding to the region between the first light-emitting element 31 and the second light-emitting element 32.

The first lower barrier layer 21 and the first upper barrier layer 41 are formed so as to face each other with the first light-emitting element 31 there between. The first light-emitting element 31 is sealed by the first lower barrier layer 21 and the first upper barrier layer 41.

The second lower barrier layer 22 and the second upper barrier layer 42 are formed so as to face each other with the second light-emitting element 32 therebetween. The second light-emitting element 32 is sealed by the second lower barrier layer 22 and the second upper barrier layer 42.

The second spacing region A2, in which the first lower barrier layer 21 and the second lower barrier layer 22 are spaced from each other, has a rigidity lower than those of the first lower barrier layer 21 and the second lower barrier layer 22. In this Embodiment, the second spacing region A2 is filled with the sealing resin 50 of an organic material, as in the first spacing region A1, as a material having a rigidity lower than those of the first lower barrier layer 21 and the second lower barrier layer 22.

By filling the second spacing region A2 with the sealing resin 50, intrusion of water from the end of the first lower barrier layer 21 and the end of the second lower barrier layer 22 can be prevented.

Thus, in this Embodiment, the first light-emitting element 31 and the second light-emitting element 32 are separately sealed. Specifically, the first light-emitting element 31 is sealed by the first lower barrier layer 21 and the first upper barrier layer 41, and the second light-emitting element 32 is sealed by the second lower barrier layer 22 and the second upper barrier layer 42.

The light-emitting device 2 according to this Embodiment further includes a first common barrier layer 61, an upper substrate 70, a first wiring 81, a first planarizing layer 91, and a second planarizing layer 92.

Each constituting member of the light-emitting device 2 according to this Embodiment will now be described in detail. In this Embodiment, constituting members that have not been described in Embodiment 1 will be mainly described.

[Sealing Resin]

The sealing resin 50 is disposed on the first upper barrier layer 41 and the second upper barrier layer 42 so as to cover the first upper barrier layer 41 and the second upper barrier layer 42. In this Embodiment, the sealing resin 50 fills between the flexible substrate 10 and the first common barrier layer 61.

The sealing resin 50 is an insulating material, such as epoxy, but is not limited to epoxy and may be an organic material such as polyimide or acryl or a hybrid material of an organic material and an inorganic material or may be a laminated film thereof.

Thus, the formation of the sealing resin 50 covering the first upper barrier layer 41 and the second upper barrier layer 42 can improve the sealing performance, compared to the case of not forming the sealing resin 50, resulting in prevention of intrusion of water from the outside. The formation of the sealing resin 50 can also disperse and relieve the stress applied to the first upper barrier layer 41 and the second upper barrier layer 42 during deformation of the light-emitting device 2.

[First Common Barrier Layer]

The first common barrier layer 61 is a barrier film (sealing film) having a barrier property to prevent the intrusion of water. The first common barrier layer 61 is a barrier film common to both the first light-emitting element 31 and the second light-emitting element 32 and is formed above the first light-emitting element 31 and the second light-emitting element 32. The first common barrier layer 61 is formed on the sealing resin 50 so as to cover both the first light-emitting element 31 and the second light-emitting element 32. Specifically, the first common barrier layer 61 is formed so as to cover the entire light-emitting region of the light-emitting device 2. The first common barrier layer 61 is formed on, for example, the inner surface of the upper substrate 70.

The first common barrier layer 61 is an inorganic sealing film made of a material mainly composed of an inorganic material. The inorganic material for the first common barrier layer 61 can be a silicon material, such as silicon nitride (SiN), silicon oxinitride (SiON), silicon oxide (SiO), or silicon carbide (SiC), or an aluminum material, such as aluminum oxide ($Al_2O_3$).

Furthermore, the material of the first common barrier layer 61 is not limited to these materials and may be a metal oxide material or a semiconductor oxide material. The first common barrier layer 61 may have, instead of a single layer structure, a layered structure. In such a case, the first common barrier layer 61 is not limited to those made of inorganic materials only and may be a laminated film of an inorganic material and a metal oxide material, a laminated film of an inorganic material and a semiconductor oxide material, a laminated film of an inorganic material and an organic material, or a film of an organic material only. For example, the first common barrier layer 61 may be a laminated film composed of an inorganic film, an organic film, an organic film, and an inorganic film in this order, but the order and the materials of the films are not limited to this.

Although the first common barrier layer 61 may be formed on the outer surface of the upper substrate 70, the formation on the inner surface of the upper substrate 70, as in this Embodiment, can prevent the first common barrier layer 61 from being damaged such as being scratched.

Thus, the intrusion of water from the top (upper substrate side) can be prevented by covering both the first light-emitting element 31 and the second light-emitting element 32 by the first common barrier layer 61.

[Upper Substrate]

The upper substrate 70 is a flexible substrate having flexibility and is disposed on the first common barrier layer 61. The upper substrate 70 is an opposite substrate disposed so as to face the flexible substrate 10 and is disposed above the sealing resin 50 so as to cover the entire light-emitting region of the light-emitting device 2. In this Embodiment, the upper substrate 70 is disposed on the first common barrier layer 61.

The upper substrate 70 can be made of, for example, an organic material, such as polyethylene terephthalate, polyimide, polyamide, polyethylene naphthalate, or polycarbonate. The material of the upper substrate 70 is, however, not limited to these materials and may be any substrate having flexibility. The upper substrate 70 is a substrate having translucency in the case of a top emission type, but may be a substrate not having translucency in the case of a bottom emission type.

Thus, the upper substrate 70 disposed so as to cover the entire can further prevent the intrusion of water from the outside. In addition, the stress applied to the first upper barrier layer 41 and the second upper barrier layer 42 during deformation of the light-emitting device 2 can be relieved.

[First Wiring]

The first wiring 81 is a connection wiring connecting the first electrode 31a of the first light-emitting element 31 to the first electrode 32a of the second light-emitting element 32. As a result, since the first electrodes 31a and 32a of the first light-emitting element 31 and the second light-emitting element 32 are connected to each other with the first wiring 81, a single power source can supply electricity to both the first light-emitting element 31 and the second light-emitting element 32.

The first wiring 81 is formed between the first lower barrier layer 21 and the second lower barrier layer 22, i.e., in the second spacing region A2.

The first wiring 81 is made of, for example, aluminum, silver, copper, an electroconductive polymer, or a carbon nanotube, but the material is not limited thereto. The first wiring 81 may be formed by patterning a metal, such as aluminum or may be formed using copper paste, silver paste, silver nanowire paste, or carbon nanotube paste. As a result, since the first wiring 81 can easily expand in the second spacing A2 where expansion and contraction can easily occur, disconnection of the first wiring 81 during deformation of the light-emitting device 2 can be prevented. The wiring that is not disconnected during deformation of the light-emitting device 2 preferably has a Young's modulus of 0.01 $kN/mm^2$ or more and 200 $kN/mm^2$ or less.

When the first wiring 81 is formed across the end of the lower barrier layer 20, the end of the lower barrier layer 20 on which the first wiring 81 is formed preferably has a forward tapered shape. When the light-emitting device 2 is deformed, the stress to the first wiring 81 is concentrated at the position striding across the ends of the lower barrier layer 20, which may disconnect the first wiring 81. The concentration of stress to the first wiring 81 at the end of the lower barrier layer 20 can be relieved by forming the end of the lower barrier layer 20 in a forward tapered shape. Consequently, disconnection of the first wiring 81 can be prevented.

In such a case, an intervening layer having forward tapered shape is preferably formed between the wiring 81 and the end of the lower barrier layer 20. As a result, since the concentration of the stress by the first wiring 81 to the end of the lower barrier layer 20 can be relieved, the first wiring 81 can be further prevented from disconnecting. The intervening layer may be the same layer as that of the first planarizing layer 91 and the second planarizing layer 92. That is, the intervening layer may be formed in the process of forming the first planarizing layer 91 and the second planarizing layer 92 using the same material.

The intervening layer may be made of, for example, a resin having elasticity, or may be made of a material containing an electroconductive material, such as an electroconductive polymer, silver nanowire paste, or carbon nanotube paste, instead of insulating resins. As a result, even if the first wiring 81 is cracked in the region striding across the ends of the lower barrier layer 20, the electroconductive material can maintain the electrical connection, resulting in prevention of poor connection.

[Planarizing Layer]

The first planarizing layer 91 is positioned between the first electrode 31a of the first light-emitting element 31 and the first lower barrier layer 21. The second planarizing layer 92 is positioned between the first electrode 32a of the second light-emitting element 32 and the second lower barrier layer 22.

The first planarizing layer 91 and the second planarizing layer 92 are made of, for example, acrylic polymers. The materials of the first planarizing layer 91 and the second planarizing layer 92 are not limited to acrylic polymers and may be other organic materials, such as polyamide, or inorganic materials and may be any arbitrary materials that can enhance the flatness.

The formation of the first planarizing layer 91 and the second planarizing layer 92 can planarize the underlayers (the first planarizing layer 91 and the second planarizing layer 92) of the first electrode 31a of the first light-emitting element 31 and the first electrode 32a of the second light-emitting element 32. As a result, the first electrode 31a of the first light-emitting element 31 and the first electrode 32a of the second light-emitting element 32 can be planarized. Consequently, the first light-emitting element 31 and the second light-emitting element 32 can more uniformly emit light.

The ends of the first planarizing layer 91 and the second planarizing layer 92 may be present on the inner sides of the ends of the lower barrier layer 20 (the first lower barrier layer 21 and the second lower barrier layer 22). In such a configuration, the lower barrier layer 20 and the upper barrier layer 40 are in contact with each other and can prevent the intrusion of water from the side surfaces.

[Advantageous Effects]

As described above, in the light-emitting device 2 according to this Embodiment, as in light-emitting device 1 in Embodiment 1, the first upper barrier layer 41 and the second upper barrier layer 42 are spaced from each other. The first spacing region A1, where the first upper barrier layer 41 and the second upper barrier layer 42 are spaced from each other, has a rigidity lower than those of the first upper barrier layer 41 and the second upper barrier layer 42.

Furthermore, in this Embodiment, the lower barrier layer 20 is also divided into the first lower barrier layer 21 and the second lower barrier layer 22 in a region corresponding to the first spacing region A1, and the second spacing region A2, where the first lower barrier layer 21 and the second lower barrier layer 22 are spaced from each other, has a rigidity lower than those of the first lower barrier layer 21 and the second lower barrier layer 22. That is, the upper barrier layer 40 and the lower barrier layer 20 are each divided in the same region.

As a result, in deformation of the light-emitting device 2, the first spacing region A1 and the second spacing region A2 having low rigidities can be selectively deformed without deforming the first upper barrier layer 41 and the first lower barrier layer 21 positioned, respectively, above and below the first light-emitting element 31 and without deforming the second upper barrier layer 42 and the second lower barrier layer 22 positioned, respectively, above and below the second light-emitting element 32.

Accordingly, compared to the light-emitting device 1 in Embodiment 1, the upper barrier layer 40 and the lower barrier layer 20 can be prevented from cracking, and the first light-emitting element 31 and the second light-emitting element 32 are prevented from expanding and contracting to prevent the first light-emitting element 31 and the second light-emitting element 32 themselves from being damaged. Consequently, a light-emitting device with further improved reliability can be provided.

Embodiment 3

Figure 3A:
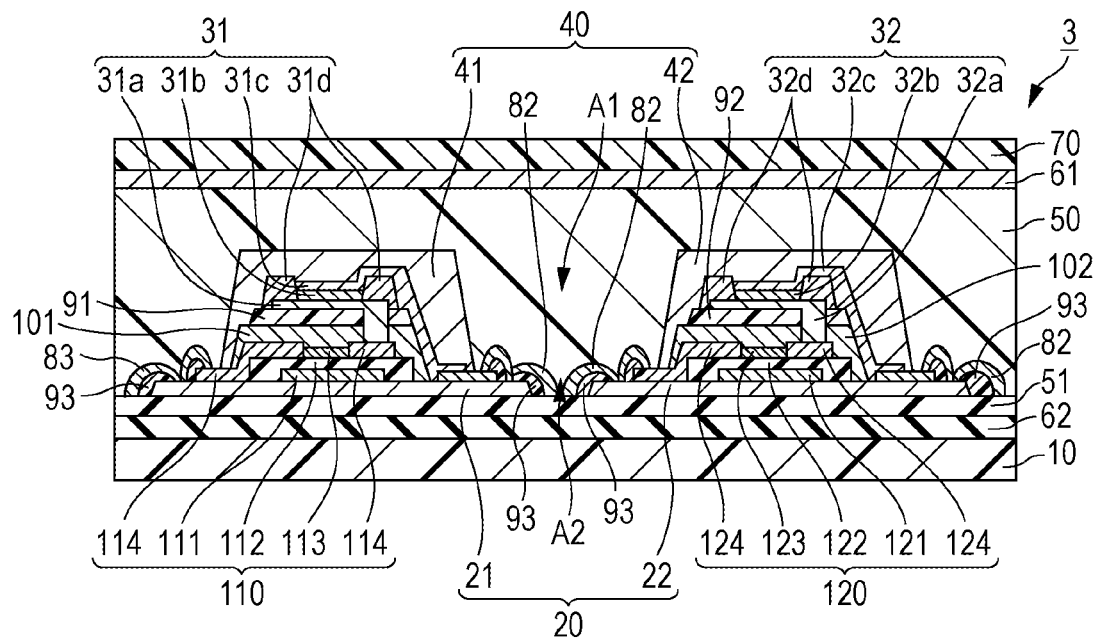
FIG. 3A is a cross-sectional view schematically illustrating the configuration of a light-emitting device according to Embodiment 3.
Figure 3B:
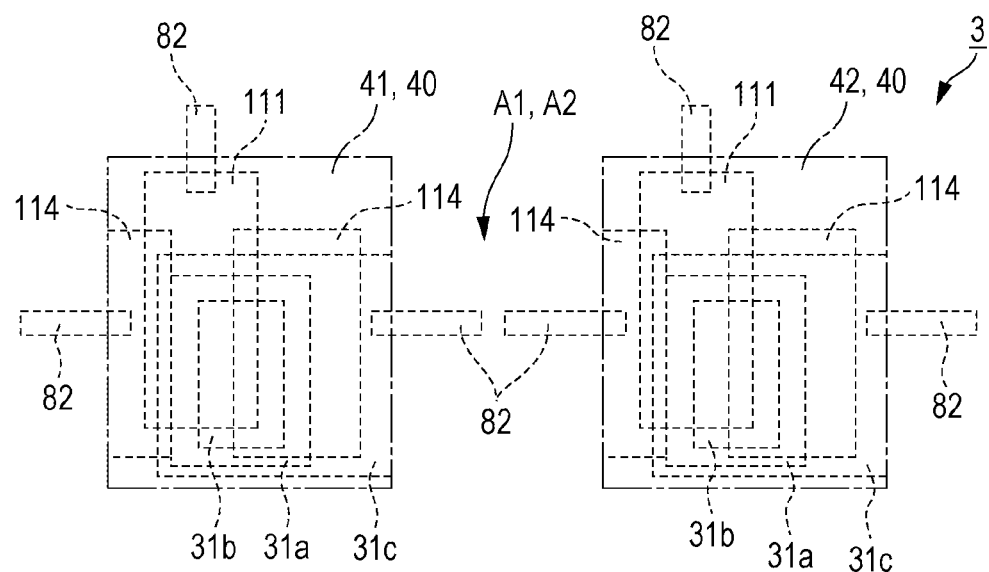
FIG. 3B is a plan view schematically illustrating the configuration of the light-emitting device according to Embodiment 3.

A light-emitting device 3 according to Embodiment 3 will be described with reference to FIGS. 3A and 3B. FIG. 3A is a cross-sectional view schematically illustrating the configuration of a light-emitting device 3 according to Embodiment 3, and FIG. 3B is a plan view schematically illustrating the configuration of the light-emitting device 3.

As shown in FIG. 3A, the light-emitting device 3 according to the Embodiment is, as in the light-emitting device 2 according to Embodiment 2, a bottom emission type light-emitting device having flexibility including light-emitting elements on a flexible base material. The device 3 includes a flexible substrate 10, a lower barrier layer 20 positioned above the flexible substrate 10, a first light-emitting element 31 and a second light-emitting element 32 positioned above the lower barrier layer 20, and an upper barrier layer 40 positioned on the first light-emitting element 31 and the second light-emitting element 32.

In also this Embodiment, the upper barrier layer 40 is divided corresponding to a first light-emitting element 31 and a second light-emitting element 32. As shown in FIGS. 3A and 3B, the upper barrier layer 40 is composed of a first upper barrier layer 41 and a second upper barrier layer 42 spaced from each other in the first spacing region A1. The first upper barrier layer 41 is positioned on the first light-emitting element 31, and the second upper barrier layer 42 is positioned on the second light-emitting element 32.

The first upper barrier layer 41 and the second upper barrier layer 42 in this Embodiment are spaced from each other in a region corresponding to the region between the first light-emitting element 31 (first thin-film transistor 110) and the second light-emitting element 32 (second thin-film transistor 120) such that the first upper barrier layer 41 seals the first light-emitting element 31 and the first thin-film transistor 110 and that the second upper barrier layer 42 seals the second light-emitting element 32 and the second thin-film transistor 120. Specifically, the first upper barrier layer 41 seals not only the first light-emitting element 31 but also the first thin-film transistor 110. Similarly, the second upper barrier layer 42 seals not only the second light-emitting element 32 but also the second thin-film transistor 120.

In also this Embodiment, as in Embodiment 2, the lower barrier layer 20 is divided corresponding to the first light-emitting element 31 and the second light-emitting element 32 and, as shown in FIGS. 3A and 3B, includes a first lower barrier layer 21 and a second lower barrier layer 22 that are spaced from each other in the second spacing region A2.

The first lower barrier layer 20 and the upper barrier layer 40 are each divided so as to also correspond to the first thin-film transistor 110 and the second thin-film transistor 120. Specifically, the first lower barrier layer 21 is formed below the first thin-film transistor 110, and the second lower barrier layer 22 is formed below the second thin-film transistor 120.

Thus, in this Embodiment, a group of the first light-emitting element 31 and the first thin-film transistor 110 and a group of the second light-emitting element 32 and the second thin-film transistor 120 are sealed separately. Specifically, the first light-emitting element 31 and the first thin-film transistor 110 are sealed by the first lower barrier layer 21 and the first upper barrier layer 41. The second light-emitting element 32 and the second thin-film transistor 120 are sealed by the second lower barrier layer 22 and the second upper barrier layer 42.

The first spacing region A1 and the second spacing region A2 are filled with a sealing resin 50 of an organic material, as in Embodiment 2.

The light-emitting device 3 according to this Embodiment, as in the light-emitting device 2 according to Embodiment 2, includes an insulating resin layer 51, a first common barrier layer 61, an upper substrate 70, a first planarizing layer 91, and a second planarizing layer 92.

The light-emitting device 3 according to this Embodiment further includes an insulating resin layer 51, a second common barrier layer 62, second wirings 82, intervening layers 93, a first passivation layer 101, a second passivation layer 102, a first thin-film transistor 110, and a second thin-film transistor 120.

Each constituting member of the light-emitting device 3 according to this Embodiment will now be described in detail. In this Embodiment, constituting members that have not been described in Embodiments 1 and 2 will be mainly described.

[Insulating Resin Layer]

The insulating resin layer 51 is disposed on the second common barrier layer 62. The insulating resin layer 51 is disposed between the second common barrier layer 62 and the lower barrier layer 20.

By forming the insulating resin layer 51, even if the second common barrier layer 62 is cracked by deformation of the light-emitting device 2, the presence of the insulating resin layer 51 can prevent influence of the water, intruding from the crack of the second common barrier layer 62, on the upper layer. Although this effect can be achieved by forming the insulating resin layer 51 at least in the second spacing region A2 between the first lower barrier layer 21 and the second lower barrier layer 22, the insulating resin layer 51 may be formed on the entire flexible substrate 10, as in this Embodiment.

The insulating resin layer 51 is made of, for example, an acrylic polymer. The material of the insulating resin layer 51 is not limited to acrylic polymers and may be another organic material, such as polyamide, or an inorganic material.

[Second Common Barrier Layer]

The second common barrier layer 62 is a barrier film (sealing film) having a barrier property to prevent the intrusion of water. The second common barrier layer 62 is a lower barrier film common to both the first light-emitting element 31 and the second light-emitting element 32 and is formed below the first light-emitting element 31 and the second light-emitting element 32. The second common barrier layer 62 is disposed between the flexible substrate 10 and the insulating resin layer 51. The second common barrier layer 62 is formed on, for example, the flexible substrate 10.

The second common barrier layer 62 is an inorganic sealing film made of a material mainly composed of an inorganic material. The inorganic material for the second common barrier layer 62 can be a silicon material, such as silicon nitride (SiN), silicon oxinitride (SiON), silicon oxide (SiO), or silicon carbide (SiC), or an aluminum material, such as aluminum oxide ($Al_2O_3$).

The material of the second common barrier layer 62 is not limited to these materials and may be a metal oxide material or a semiconductor oxide material. The second common barrier layer 62 may have, instead of a single layer structure, a layered structure. In such a case, the second common barrier layer 62 is not limited to those made of inorganic materials only and may be a laminated film of an inorganic material and a metal oxide material, a laminated film of an inorganic material and a semiconductor oxide material, a laminated film of an inorganic material and an organic material, or a film of an organic material only. For example, the second common barrier layer 62 may be a laminated film composed of an inorganic film, an organic film, an organic film, and an inorganic film in this order, but the order and the materials of the films are not limited to this.

Thus, the intrusion of water from the bottom (flexible substrate 10 side) can be prevented by forming the second common barrier layer 62 below the first light-emitting element 31 and the second light-emitting element 32.

[Second Wiring]

The second wirings 82 are connection wirings connected to the electrodes of the first light-emitting element 31 and the second light-emitting element 32 or the electrode of the first thin-film transistor 110 and the second thin-film transistor 120. The second wirings 82 are composed of a plurality of lines of wiring connected to, for example, the second electrode 31c of the first light-emitting element 31, the second electrode 32c of the second light-emitting element 32, the source/drain electrodes 114 of the first thin-film transistor 110, and the source/drain electrodes 124 of the second thin-film transistor 120.

Some of the second wirings 82 are formed in the region between the first lower barrier layer 21 and the second lower barrier layer 22, i.e., in the second spacing region A2.

The second wirings 82 can be made of the same material as that of the first wiring 81. For example, the second wirings 82 are made of aluminum, silver, copper, an electroconductive polymer, or a carbon nanotube, but the material is not limited thereto. The second wirings 82 may be formed using copper paste, silver paste, silver nanowire paste, or carbon nanotube paste. As a result, since the second wirings 82 can easily expand in the second spacing A2 where expansion and contraction can easily occur, disconnection of the second wirings 82 during deformation of the light-emitting device 3 can be prevented. The second wirings 82 used preferably have a Young's modulus of 0.01 $kN/mm^2$ or more and 200 $kN/mm^2$ or less.

Some of the second wirings 82 stride across the ends of the lower barrier layer 20. In such a case, the end of the lower barrier layer 20 on which the second wirings 82 are formed preferably has a forward tapered shape. The concentration of stress to the second wirings 82 at the end of the lower barrier layer 20 when the light-emitting device 3 is deformed can be relieved by forming the end of the lower barrier layer 20 under the second wiring 82 in a forward tapered shape. Consequently, disconnection of the second wiring 82 can be prevented.

[Intervening Layer]

The intervening layer 93 is disposed between the second wiring 82 and the lower barrier layer 20. The intervening layer 93 disposed between the second wiring 82 and the end of the lower barrier layer 20 preferably has a forward tapered shape.

As a result, the concentration of stress to the second wiring 82 present at the end of the lower barrier layer 20 can be relieved to prevent disconnection of the second wiring 82.

The intervening layer 93 may be the same layer as that of the first planarizing layer 91 and the second planarizing layer 92. That is, the intervening layer 93 may be formed in the process of forming the first planarizing layer 91 and the second planarizing layer 92 using the same material.

intervening layer 93 may be made of, for example, a resin having elasticity, or may be made of a material containing an electroconductive material, such as an electroconductive polymer, silver nanowire paste, or carbon nanotube paste, instead of insulating resins. As a result, even if the second wiring 82 is cracked in the region striding across the ends of the lower barrier layer 20, the electroconductive material can maintain the electrical connection, resulting in prevention of poor connection.

[Passivation Layer]

The first passivation layer (first passivation film) 101 is formed so as to cover the first thin-film transistor 110. The second passivation layer (second passivation film) 102 is formed so as to cover the second thin-film transistor 120.

The reliability of the first thin-film transistor 110 and the second thin-film transistor 120 is improved by covering the first thin-film transistor 110 and the second thin-film transistor 120 with the first passivation layer 101 and the second passivation layer 102, respectively.

The first passivation layer 101 is preferably connected to at least one of the first upper barrier layer 41 and the first lower barrier layer 21 directly or via a metal material or an inorganic material. The second passivation layer 102 is preferably connected to at least one of the second upper barrier layer 42 and the second lower barrier layer 22 directly or via a metal material or an inorganic material.

As a result, the first passivation layer 101 (the second passivation layer 102) covers not only the upper surface portion but also the side surface portion of the first thin-film transistor 110 (the second thin-film transistor 120) to prevent the intrusion of water from the side surface portion of the first thin-film transistor 110 (the second thin-film transistor 120).

The first passivation layer 101 and the second passivation layer 102 can be made of, for example, $Al_2O_3$, but the material is not limited thereto. The materials of the first passivation layer 101 and the second passivation layer 102 may be organic materials having insulation properties, such as polyimide, instead of inorganic materials, such as $SiO_2$.

[Thin-Film Transistor]

The first thin-film transistor 110 is disposed below the first light-emitting element 31. The first thin-film transistor 110 is composed of a gate electrode 111, a gate insulating film 112, a semiconductor layer 113, and a pair of source/drain electrodes 114. One of the pair of source/drain electrodes 114 is connected to the first electrode 31a of the first light-emitting element 31 through a contact hole formed in the first planarizing layer 91 and the first passivation layer 101.

The second thin-film transistor 120 is disposed below the second light-emitting element 32. The second thin-film transistor 120 is composed of a gate electrode 121, a gate insulating film 122, a semiconductor layer 123, and a pair of source/drain electrodes 124. One of the pair of source/drain electrodes 124 is connected to the first electrode 32a of the second light-emitting element 32 through a contact hole formed in the second planarizing layer 92 and the second passivation layer 102.

The gate electrodes 111 and 121 each have a single layer structure or a multilayer structure of, for example, an electroconductive material or its alloy, such as molybdenum (Mo), aluminum (Al), copper (Cu), tungsten (W), tantalum (Ta), niobium (Nb), nickel (Ni), titanium (Ti), chromium (Cr), or molybdenum tungsten (MoW). The materials for the gate electrodes 111 and 121 are not limited to these metal materials and may be other metal materials or may be any materials having electrical conductivity, for example, metal oxides, such as ITO, electroconductive polymers, carbon nanotubes, silver paste, or silver nanowire. The gate electrodes 111 and 121 each have a thickness of, for example, about 20 to 500 nm.

The gate insulating films 112 and 122 are inorganic films of, for example, SiO, but the materials are not limited thereto. The materials of the gate insulating films 112 and 122 may be organic materials, such as resins, as long as they have insulation properties.

The semiconductor layers 113 and 123 are made of, for example, organic semiconductor, but the materials are not limited thereto. The materials of the semiconductor layers 113 and 114 may be semiconductor materials showing transistor characteristics, such as oxide semiconductors and silicon semiconductors.

The semiconductor layers 113 and 123 may be partitioned by partition wall layers (banks). The partition wall layers play a role like a dam when an organic semiconductor material is applied by, for example, ink jetting and function so as to retain the organic semiconductor material in the openings of the partition wall layers.

The source/drain electrodes 114 and 124 are each either a source electrode or a drain electrode. The source/drain electrodes 114 and 124 each have a single layer structure or a multilayer structure of, for example, an electroconductive material or its alloy, such as molybdenum (Mo), aluminum (Al), copper (Cu), tungsten (W), tantalum (Ta), niobium (Nb), nickel (Ni), titanium (Ti), chromium (Cr), or molybdenum tungsten (MoW). The materials of the source/drain electrodes 114 and 124 are not limited to these metal materials and may be other metal materials or may be any materials having electrical conductivity, for example, metal oxides, such as ITO, electroconductive polymers, carbon nanotubes, silver paste, or silver nanowire. The source/drain electrodes 114 and 124 each have a thickness of, for example, about 20 to 500 nm.

[Pixel Configuration]

Figure 4:
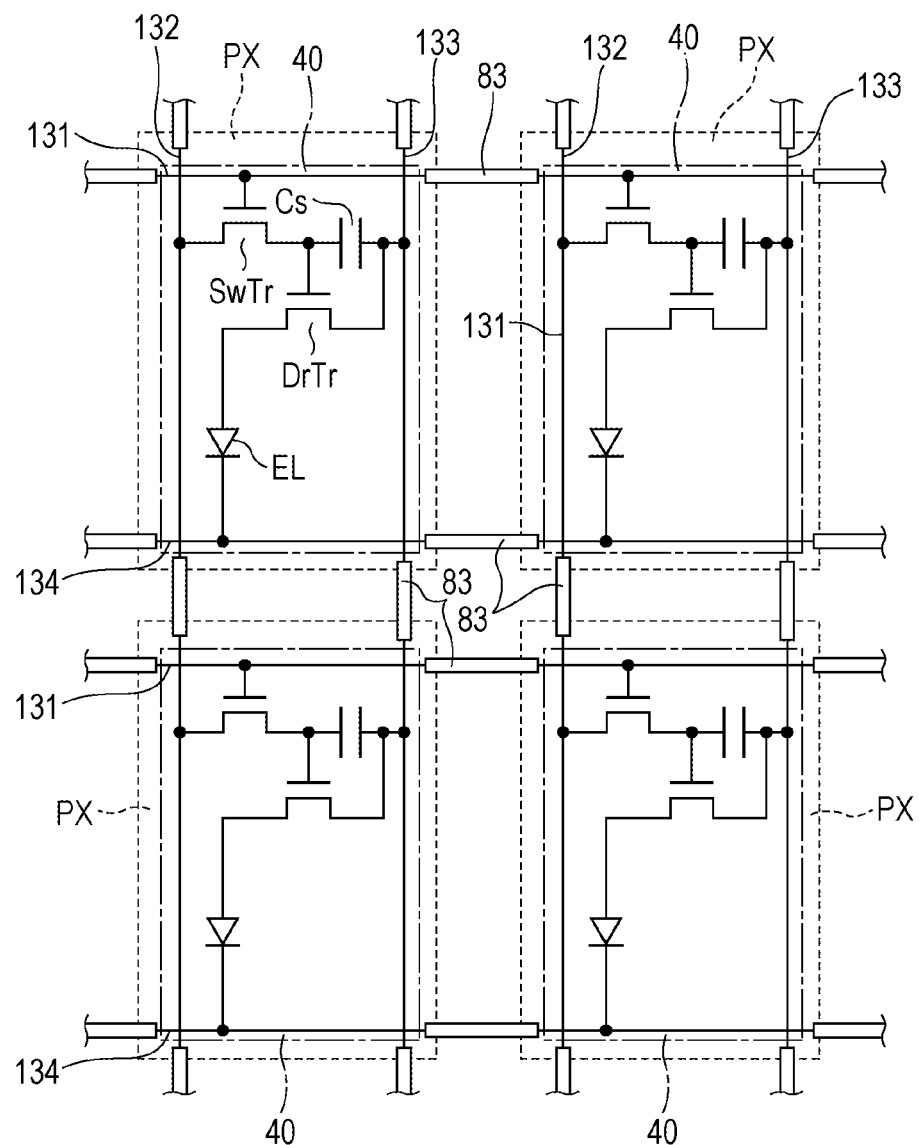
FIG. 4 is a diagram illustrating the configuration of the pixel circuit of the light-emitting device according to Embodiment 3.
Figure 5A:
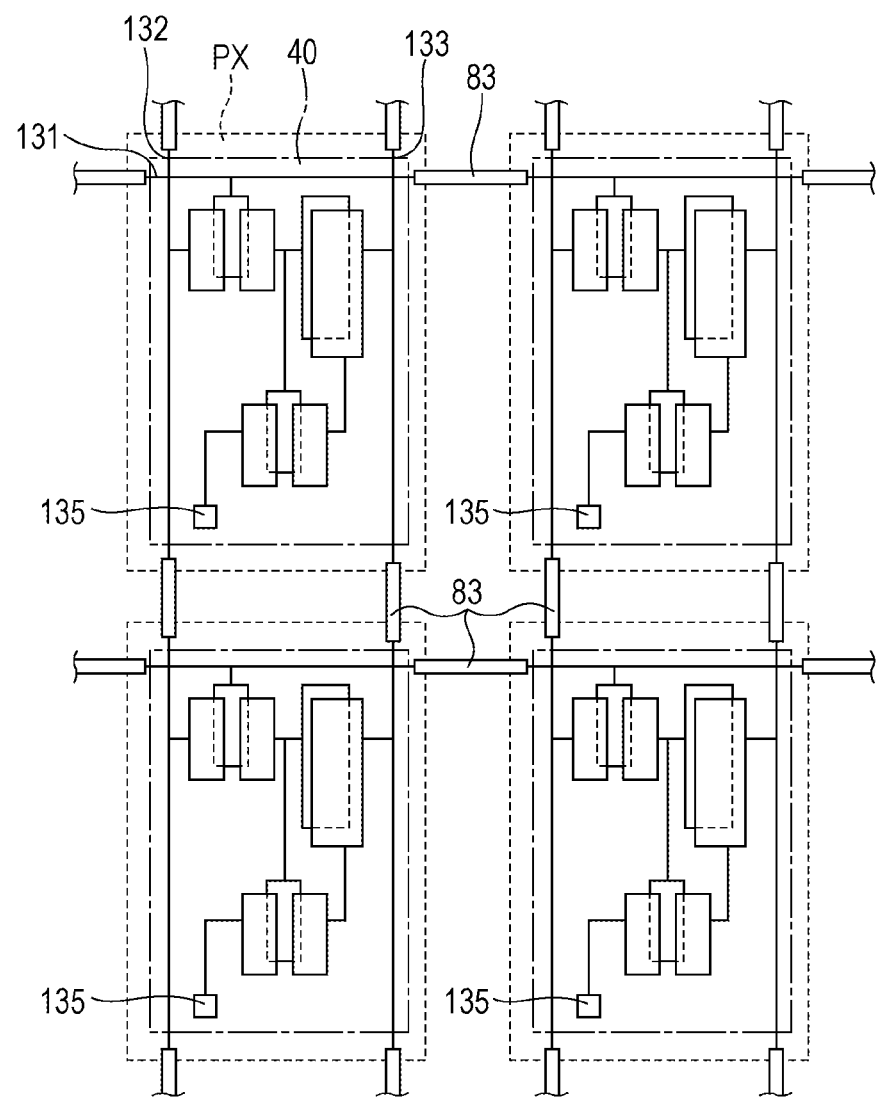
FIG. 5A is a schematic diagram illustrating the configuration of the TFT layer of the light-emitting device according to Embodiment 3.
Figure 5B:
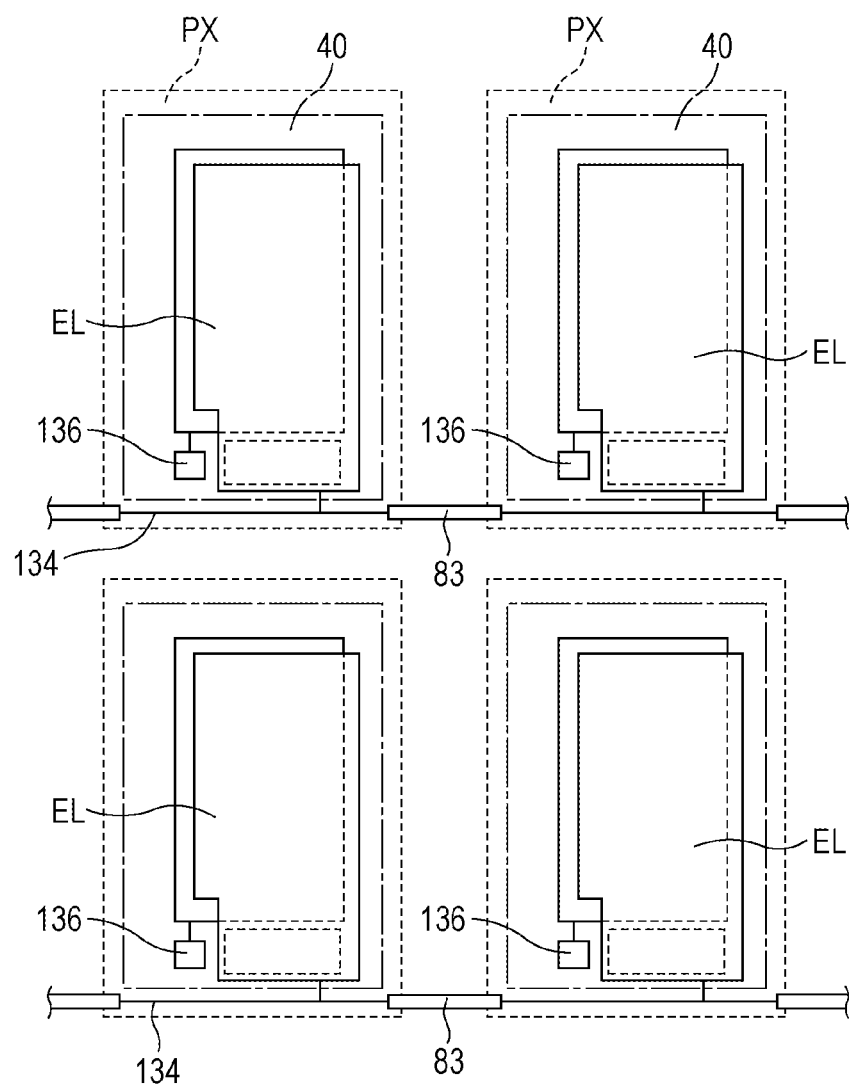
FIG. 5B is a schematic diagram illustrating the configuration of the EL layer of the light-emitting device according to Embodiment 3.

The light-emitting device 3 according to this Embodiment has, for example, a pixel configuration shown in FIGS. 4, 5A, and 5B. The pixel circuit shown in FIG. 4 controls the emission of the light-emitting device 3. FIG. 4 is a diagram illustrating the configuration of the pixel circuit (drive circuit) of the light-emitting device 3 according to Embodiment 3. FIG. 5A is a schematic diagram illustrating the configuration of the TFT layer of the light-emitting device 3 according to Embodiment 3, and FIG. 5B is a schematic diagram illustrating the configuration of the EL layer of the light-emitting device 3.

As shown in FIGS. 4, 5A, and 5B, the light-emitting device 3 includes a plurality of pixels PX arranged in a matrix form. Each pixel PX is composed of a driving transistor DrTr of a thin-film transistor, a switching transistor SwTr of a thin-film transistor, a capacitive element (capacitor) Cs serving as a storage capacitor (retention capacitor) for storing a data voltage, and an organic electroluminescent (EL) element EL of a light-emitting element. The configuration of the pixel circuit is not limited thereto.

The driving transistor DrTr and the switching transistor SwTr are TFTs controlling the organic EL element (light-emitting element). Specifically, the driving transistor DrTr is a TFT for driving the organic EL element EL, whereas the switching transistor SwTr is a TFT for selecting an organic EL element EL (pixel PX) to emit light. The driving transistor DrTr and the switching transistor SwTr are the first thin-film transistor 110 or the second thin-film transistor 120 in the light-emitting device 3. The organic EL element EL is the first light-emitting element 31 or the second light-emitting element 32 in the light-emitting device 3.

As shown in FIG. 4, the light-emitting device 3 includes a plurality of scanning lines (gate wiring) 131 arranged along the row direction of the pixels PX, a plurality of data lines (source wiring) 132 arranged along the column direction of the pixels PX so as to be orthogonal to the scanning lines 131, a plurality of power supply lines (power source wiring) 133 arranged so as to be parallel to the data lines 132, and a plurality of cathode lines 134 arranged so as to be parallel to the scanning lines 131.

A scanning line 131 is connected to the gate electrodes of switching transistors SwTr of the pixels PX arranged in one row, whereas a data line 132 is connected to the drain electrodes of switching transistors SwTr of the pixels PX arranged in one column. A power supply line 133 is connected to the source electrodes of driving transistors DrTr of the pixels PX arranged in one column. A cathode line 134 is connected to the cathodes of organic EL elements EL of the pixels PX arranged in one row.

These wirings are formed so as to cross with one another in a grade separation via an interlayer insulating film. In this Embodiment, the cathode line 134 is formed in the same layer as that of the first electrodes (lower electrodes) of the organic EL elements and is connected to other wirings and is extracted to the outside of the light-emitting device. The configuration is, however, not limited thereto, and the cathode line 134 may be connected to the electrode or the wiring in the same layer as that of the scanning line and may be extracted to the outside.

The switching transistor SwTr is, for example, an organic thin-film transistor and includes a gate electrode connected to the scanning line 131, a drain electrode connected to the data line 132, a source electrode connected to one electrode of the capacitive element Cs and the gate electrode of the driving transistor DrTr, and an organic semiconductor layer functioning as a channel layer.

When a prescribed voltage is applied to the scanning line 131 and the data line 132 connected to the switching transistor SwTr, the voltage applied to the data line 132 is retained in the capacitive element Cs as a data voltage.

The driving transistor DrTr is, for example, an organic thin-film transistor and includes a gate electrode connected to the source electrode of the switching transistor SwTr and one electrode of the capacitive element Cs, a source electrode connected to the power supply line 133 and the other electrode of the capacitive element Cs, a drain electrode connected to the anode of the organic EL element EL, and an organic semiconductor layer functioning as a channel layer.

As shown in FIGS. 5A and 5B, the drain electrode of the driving transistor DrTr in the TFT layer and the anode (first electrode) of the organic EL in the EL layer are connected via contacting portions 135 and 136. The contacting portions 135 and 136 are connected, for example, through contact holes formed in the passivation layer disposed between the TFT layer and the EL layer.

The driving transistor DrTr supplies a current corresponding to the data voltage retained by the capacitive element Cs to the anode of the organic EL element EL from the power supply line 133 through the drain electrode of the driving transistor DrTr. As a result, in the organic EL element EL, a driving current flows from the anode to the cathode to emit light by the organic EL layer.

As shown in FIG. 4, each of the multiple pixels PX includes an upper barrier layer 40. Each pixel PX also includes a first upper barrier layer 41 and a second upper barrier layer 42 (not shown). Accordingly, the organic EL elements EL (light-emitting elements) and the upper barrier layers 40 are arranged in a matrix form.

As shown in FIGS. 4, 5A, and 5B, each of the scanning lines 131, the data lines 132, the power supply lines 133, and the cathode lines 134 is provided with a third wiring 83. The third wiring 83 is disposed between adjacent pixels PX.

Specifically, as shown in FIG. 5A, the electrodes of the switching transistors SwTr of adjacent pixels are connected to each other with the third wiring 83. Similarly, the electrodes of the driving transistors DrTr of adjacent pixels are connected to each other with the third wiring 83. In addition, as shown in FIG. 5B, the electrodes of the organic EL elements EL of adjacent pixels are connected to each other with the third wiring 83.

The third wiring 83 is disposed, for example, between the first lower barrier layer 21 and the second lower barrier layer 22, i.e., in the second spacing region A2. The third wiring 83 can be formed with the same material as that of the second wiring 82. The shape of the third wiring 83 in a planar view is, for example, linear, but is not limited thereto.

An example of the thus-configured light-emitting device 3 is a display of an active matrix driving system using the pixels PX as the display pixels. In such a case, the pixels PX are sub-pixels and are red pixels, green pixels, and blue pixels.

In this Embodiment, the EL layer is disposed above the TFT layer, and the display is of a top emission type extracting light from the top. The display is, however, not limited thereto and may be of a bottom emission type. In this Embodiment, although only the light-emitting region (display region) is shown, the light-emitting device may have a built-in circuit element, such as a gate drive (control circuit). In this case, the circuit element may be sealed with a barrier layer separately.

[Advantageous Effects]

As described above, in the light-emitting device 3 according to this Embodiment, as in light-emitting device 2 in Embodiment 2, the first upper barrier layer 41 and the second upper barrier layer 42 are spaced from each other. The first spacing region A1, where the first upper barrier layer 41 and the second upper barrier layer 42 are spaced from each other, has a rigidity lower than those of the first upper barrier layer 41 and the second upper barrier layer 42. In addition, the first lower barrier layer 21 and the second lower barrier layer 22 are spaced from each other. The second spacing region A2, where the first lower barrier layer 21 and the second lower barrier layer 22 are spaced from each other, has a rigidity lower than those of the first lower barrier layer 21 and the second lower barrier layer 22.

As a result, in deformation of the light-emitting device 3, the first spacing region A1 and the second spacing region A2 having low rigidities can be selectively deformed without deforming the first upper barrier layer 41 and the first lower barrier layer 21 positioned, respectively, above and below first thin-film transistor 110 and the first light-emitting element 31 and without deforming the second upper barrier layer 42 and the second lower barrier layer 22 positioned, respectively, above and below the second thin-film transistor 120 and the second light-emitting element 32.

Accordingly, the upper barrier layer 40 and the lower barrier layer 20 can be prevented from cracking, and the first light-emitting element 31, the second light-emitting element 32, the first thin-film transistor 110, and the second thin-film transistor 120 are prevented from expanding and contracting to prevent the these elements themselves from being damaged. Consequently, a light-emitting device having TFTs with high reliability can be provided.

In this Embodiment, a plurality of pixels arranged in a matrix form is driven by the TFTs. Consequently, picture display can be freely performed. In addition, full color display can be performed by arranging RGB light-emitting elements. As a result, a picture display device with high quality can be provided.

Furthermore, in this Embodiment, a plurality of pixels are driven by active matrix driving with TFTs. As a result, picture display with high quality and high luminance can be performed.

In this Embodiment, although a plurality of pixels are driven by an active matrix driving system, the pixels may be driven by a passive matrix driving system.

Embodiment 4

Figure 6A:
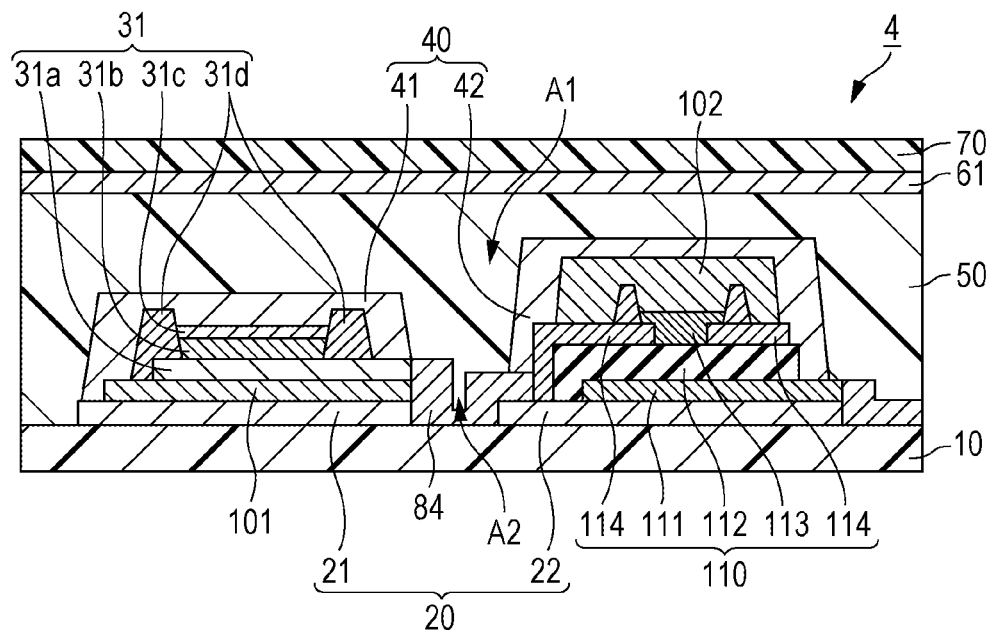
FIG. 6A is a cross-sectional view schematically illustrating the configuration of a light-emitting device according to Embodiment 4.

A light-emitting device 4 according to Embodiment 4 will now be described with reference to FIGS. 6A and 6B. FIG. 6A is a cross-sectional view schematically illustrating the configuration of the light-emitting device 4 according to Embodiment 4, and FIG. 6B is a plan view schematically illustrating the configuration of the light-emitting device 4.

As shown in FIG. 6A, the light-emitting device 4 according to this Embodiment has flexibility by forming the light-emitting element and the TFT on a flexible substrate so as to be separated from each other in the planar direction. That is, the light-emitting element and the TFT are not laminated in this Embodiment and are formed in different regions without overlapping each other in a planar view, whereas the light-emitting element and the TFT are laminated in Embodiment 3.

The light-emitting device 4 according to this Embodiment includes a flexible substrate 10, a lower barrier layer 20 positioned on the flexible substrate 10, a first light-emitting element 31 and a first thin-film transistor 110 positioned on the lower barrier layer 20, and an upper barrier layer 40 positioned on the first light-emitting element 31 and the first thin-film transistor 110.

Figure 6B:
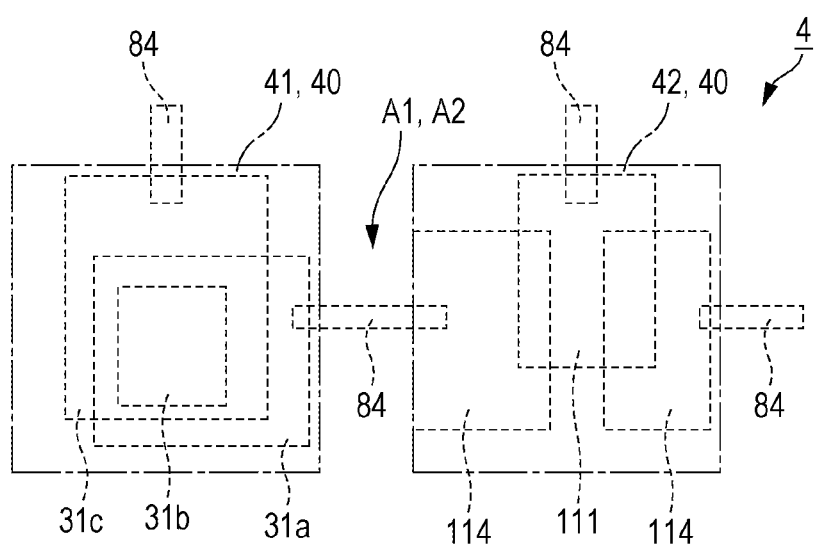
FIG. 6B is a plan view schematically illustrating the configuration of the light-emitting device according to Embodiment 4.

The upper barrier layer 40 is divided corresponding to the first light-emitting element 31 and the first thin-film transistor 110 and, as shown in FIGS. 6A and 6B, includes a first upper barrier layer 41 and a second upper barrier layer 42 that are spaced from each other in the first spacing region A1. The first upper barrier layer 41 is positioned above the first light-emitting element 31, and the second upper barrier layer 42 is positioned above the first thin-film transistor 110.

The lower barrier layer 20 is also divided corresponding to the first light-emitting element 31 and the first thin-film transistor 110 and includes a first lower barrier layer 21 and a second lower barrier layer 22 that are spaced from each other in the second spacing region A2. The first lower barrier layer 21 is positioned below the first light-emitting element 31, and the second lower barrier layer 22 is positioned below the first thin-film transistor 110.

Thus, in this Embodiment, the first light-emitting element 31 and the first thin-film transistor 110 are sealed separately.

Specifically, the first light-emitting element 31 is sealed by the first lower barrier layer 21 and the first upper barrier layer 41, and the first thin-film transistor 110 is sealed by the second lower barrier layer 22 and the second upper barrier layer 42.

The first spacing region A1 and the second spacing region A2 are filled with a sealing resin 50 of an organic material, as in Embodiment 3.

The light-emitting device 4 according to this Embodiment, as in the light-emitting device 3 according to Embodiment 3, includes a first common barrier layer 61, an upper substrate 70, a fourth wiring 84, a first passivation layer 101, and a second passivation layer 102.

The fourth wiring 84 is a connection wiring connecting the first light-emitting element 31 and the first thin-film transistor 110. That is, the fourth wiring 84 connects an EL layer and a TFT layer. In this Embodiment, the fourth wiring 84 connects the first electrode 31a of the first light-emitting element 31 and the source/drain electrode 114 of the first thin-film transistor 110. The fourth wiring 84 is disposed between the first lower barrier layer 21 and the second lower barrier layer 22, i.e., in the second spacing region A2. The fourth wiring 84 can be made of the same material as the first wiring 81.

Thus, the first light-emitting element 31 can be controlled with the first thin-film transistor 110 by connecting the first light-emitting element 31 and the first thin-film transistor 110 with the fourth wiring 84.

The first passivation layer 101 is disposed between the first light-emitting element 31 and the lower barrier layer 20 (the first lower barrier layer 21), whereas the second passivation layer 102 is disposed on the first thin-film transistor 110. The first passivation layer 101 and the second passivation layer 102 are made of the same material and have the same thickness. That is, the first passivation layer 101 and the second passivation layer 102 are formed by the same process.

Thus, the passivation layers having barrier properties can be formed by the same process (simultaneously) under the first light-emitting element 31 and on the first thin-film transistor 110. As a result, the barrier properties of the first light-emitting element 31 and the first thin-film transistor 110 can be enhanced without increasing the number of processes.

In addition, the use of the first passivation layer 101 and the second passivation layer 102 as planarizing layers can improve the flatness of the first electrode 31a on the first passivation layer 101 and also can improve the flatness of the upper layer of the first thin-film transistor 110.

The first passivation layer 101 and the second passivation layer 102 may be formed separately by different processes.

[Advantageous Effects]

As described above, in the light-emitting device 4 according to this Embodiment, the first upper barrier layer 41 and the second upper barrier layer 42 are spaced from each other in the region between the first light-emitting element 31 and the first thin-film transistor 110, and the first spacing region A1, where the first upper barrier layer 41 and the second upper barrier layer 42 are spaced from each other, has a rigidity lower than those of the first upper barrier layer 41 and the second upper barrier layer 42.

Furthermore, in this Embodiment, the lower barrier layer 20 is divided into the first lower barrier layer 21 and the second lower barrier layer 22 spaced from each other in the second spacing region A2. The second spacing region A2, where the first lower barrier layer 21 and the second lower barrier layer 22 are spaced from each other, has a rigidity lower than those of the first lower barrier layer 21 and the second lower barrier layer 22.

As a result, when the light-emitting device 4 is deformed by bending, expanding, or contracting, the first spacing region A1 and the second spacing region A2 having low rigidities can be selectively deformed without deforming the first upper barrier layer 41 and the first lower barrier layer 21 positioned, respectively, above and below the first light-emitting element 31 and also the second upper barrier layer 42 and the second lower barrier layer 22 positioned, respectively, above and below the first thin-film transistor 110.

Accordingly, the light-emitting device 4 as a whole can prevent the upper barrier layer 40 and the lower barrier layer 20 from cracking, while having stretchability, and can prevent the first light-emitting element 31 and the first thin-film transistor 110 from expanding and contracting to prevent the first light-emitting element 31 and the first thin-film transistor 110 themselves from being damaged. As a result, a light-emitting device with high reliability can be provided.

MODIFICATION EXAMPLE

Light-emitting devices have been described based on Embodiments, but the present disclosure is not limited to these Embodiments.

For example, in the above-described Embodiments, light-emitting elements and thin-film transistors have been described as examples of the circuit element. The present disclosure, however, can be applied not only to the combination of light-emitting elements and thin-film transistors but also to other circuit elements that can be formed on a flexible substrate. For example, the present disclosure can be applied to a sensor, such as a touch sensor or a pressure sensor, a boosting circuit, or an actuator.

Figure 7:
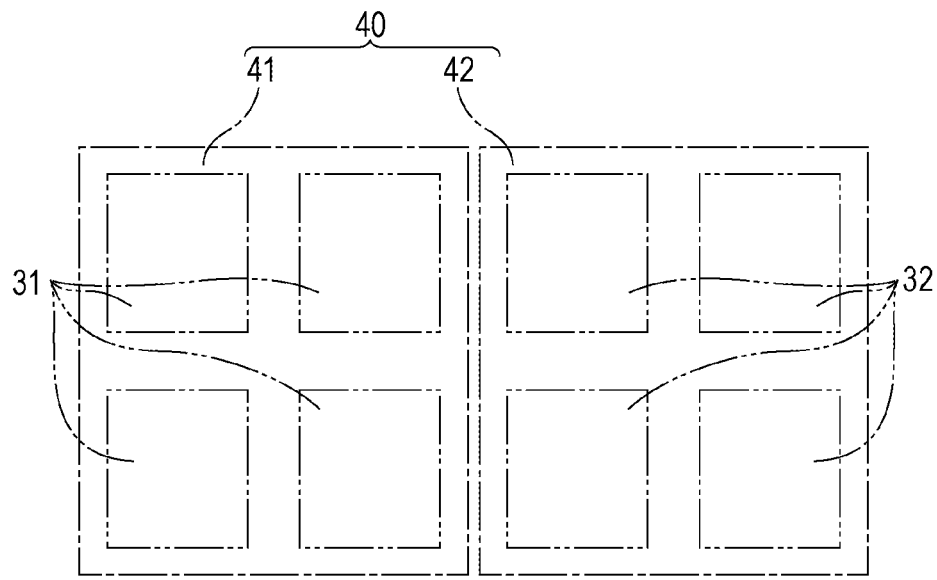
FIG. 7 is a plan view schematically illustrating the configuration of a light-emitting device according to Modification Example 1.

In the above-described Embodiments, one barrier layer seals one circuit element, but the present disclosure is not limited thereto. That is, each of a plurality of barrier layers may seal a plurality of circuit elements. For example, as shown in FIG. 7, a first upper barrier layer 41 may seal four first light-emitting elements 31, collectively, as one unit, and a second upper barrier layer 42 may seal four second light-emitting element 32, collectively, as one unit. That is, the number of circuit elements sealed by one barrier layer is not limited to one.

Figure 8:
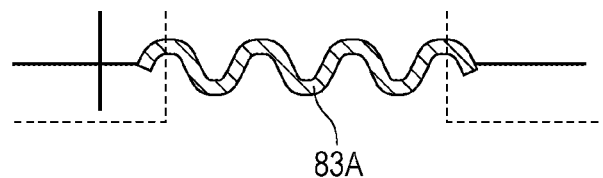
FIG. 8 is a diagram illustrating the configuration of the third wiring of a light-emitting device according to Modification Example 2.

In Embodiment 3, the shape of the third wiring 83 formed in the second spacing region A2 is linear in a planar view. As shown in FIG. 8, however, the shape of the third wiring 83A in a planar view may be a meander shape or a bellows shape.

Here, the bellows shape in a planar view refers to a shape of a wiring winding in the X-Y plane, where the X-axis and the Y-axis are defined on a plane of the light-emitting device and the Z-axis (the axis orthogonal to the X-axis and the Y-axis) is defined in the direction in which the light-emitting device emits light.

Thus, the use of the third wiring 83A having a meander shape or a bellows shape in a planar view relieves the stress applied to the third wiring 83A in the second spacing region A2, which easily expands or contracts, during the expansion or contraction of the light-emitting device, and allows the third wiring 83A to be easily expanded or contracted. As a result, disconnection of the third wiring 83A can be prevented.

The wiring in such a meander or bellows shape can be applied not only to the third wiring 83 but also to the first wiring 81, the second wiring 82, and the fourth wiring 84.

Figure 9:
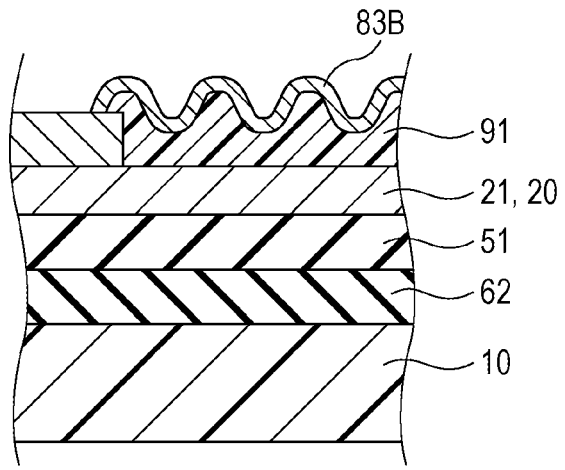
FIG. 9 is a cross-sectional view illustrating the configuration of the third wiring of a light-emitting device according to Modification Example 3.

In addition, as shown in FIG. 9, the third wiring 83B formed in the second spacing region may have an uneven shape in a sectional view.

Here, the uneven shape in a sectional view refers to a shape of a wiring forming unevenness in the Z-axis, where the X-axis and the Y-axis are defined on a plane of the light-emitting device and the Z-axis (the axis orthogonal to the X-axis and the Y-axis) is defined in the direction in which the light-emitting device emits light.

Thus, the use of the third wiring 83B having an uneven shape in a sectional view relieves the stress applied to the third wiring 83B in the second spacing region A2, which easily expands or contracts, during the expansion or contraction of the light-emitting device, and allows the third wiring 83B to be easily expanded or contracted. As a result, disconnection of the third wiring 83B can be prevented.

Such third wiring 83B in an uneven shape can be formed by patterning the underlayer of the third wiring 83B into an uneven shape and forming a film of the third wiring 83 thereon. In this case, for example, as shown in FIG. 9, the first planarizing layer 91 can be used as the underlayer of the third wiring 83B. Alternatively, a resin layer having an uneven surface may be additionally formed directly below the third wiring 83.

Such a wiring in an uneven shape can be applied not only to the third wiring 83 but also to the first wiring 81, the second wiring 82, and the fourth wiring 84.

In the above-described Embodiments, although no component is placed between the first light-emitting element 31 and the first upper barrier layer 41 and between the second light-emitting element 32 and the second upper barrier layer 42, planarizing layers may be formed directly below the first upper barrier layer 41 and the second upper barrier layer 42.

As a result, the planarizing layer can absorb the unevenness due to the formation of the first light-emitting element 31 and the second light-emitting element 32 to planarize the surface. Accordingly, in deformation of the light-emitting device, since the concentration of stress to the first upper barrier layer and the second upper barrier layer can be relieved, the light-emitting device can have high reliability.

Such formation can be applied not only to the case of forming a light-emitting element directly below the first upper barrier layer 41 or directly below the second upper barrier layer 42 but also to the case of forming a thin-film transistor directly below the first upper barrier layer 41 or directly below the second upper barrier layer 42.

In the above-described Embodiments, light-emitting devices that are usually used in an undeformed state but can be bent, expanded, or contracted have been described, but the present disclosure is not limited thereto. The present disclosure can also be applied to light-emitting devices fixed in an expanded state, a contracted state, or a bent state.

The present disclosure also encompasses embodiments provided by various modifications that can be conceived by those skilled in the art to the above-described Embodiments and Modification Examples and embodiments provided by arbitrarily combining the components and the functions in the above described Embodiments and Modification Examples within the gist of the present disclosure.

What is claimed is:
1. A light-emitting device comprising:
   a flexible substrate;
   a lower barrier layer positioned above the flexible substrate;
   a light-emitting element and a thin-film transistor controlling the light-emitting element positioned above the lower barrier layer, wherein the light-emitting element includes a light-emitting layer;

a first upper barrier layer positioned above the light-emitting layer of the light-emitting element and including a first inorganic material; and a second upper barrier layer positioned above the thin-film transistor and including a second inorganic material, wherein the first upper barrier layer and the second upper barrier layer are spaced from each other at least in a region between the light-emitting element and the thin-film transistor, and wherein the light-emitting device further comprises a resin layer composed of organic material above the first and second upper barrier layers, and disposed in the region between the light-emitting element and the thin-film transistor.

2. The light-emitting device according to claim 1, wherein the lower barrier layer includes a first lower barrier layer and a second lower barrier layer spaced from each other;

the light-emitting element is positioned above the first lower barrier layer; and the thin-film transistor is positioned above the second lower barrier layer.

3. The light-emitting device according to claim 1, further comprising:

a connection wiring connecting the light-emitting element and the thin-film transistor.

4. The light-emitting device according to claim 1, further comprising:

a first passivation layer disposed between the light-emitting element and the lower barrier layer; and a second passivation layer disposed above the thin-film transistor, wherein the first passivation layer and the second passivation layer are made of the same material and have the same thickness.

5. The light-emitting device according to claim 1, wherein the thin-film transistor has a source/drain electrode, and wherein the light-emitting device further comprises a connection wiring directly connecting the light-emitting element to the source/drain electrode of the thin-film transistor and different from the source/drain electrode of the thin-film transistor.

6. The light-emitting device according to claim 1, wherein the lower barrier layer includes spaced apart first and second lower barrier layers, the first and second lower barrier layers being spaced apart in a second region that is filled with the resin layer composed of organic material between the light-emitting element and the thin-film transistor, and the first and second lower barrier layers being positioned, respectively, below the light-emitting element and the thin-film transistor, and wherein the second region has a rigidity lower than those of the first lower barrier layer and the second lower barrier layer, due to the resin layer composed of organic material in the second region.

* * * * *